(12) United States Patent
Thiagarajan et al.

(10) Patent No.: US 8,040,266 B2
(45) Date of Patent: Oct. 18, 2011

(54) PROGRAMMABLE SIGMA-DELTA ANALOG-TO-DIGITAL CONVERTER

(75) Inventors: Eashwar Thiagarajan, Bothell, WA (US); Mohandas Palatholmana Sivadasan, Karnataka (IN); Gajender Rohilla, Bothell, WA (US); Harold Kutz, Edmonds, WA (US); Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/060,128

(22) Filed: Mar. 31, 2008

(65) Prior Publication Data
US 2008/0297388 A1    Dec. 4, 2008

Related U.S. Application Data

(60) Provisional application No. 60/912,399, filed on Apr. 17, 2007.

(51) Int. Cl.
*H03M 3/00*    (2006.01)
(52) U.S. Cl. .................... 341/143; 341/155
(58) Field of Classification Search ............. 341/143, 341/155, 141, 166
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |

(Continued)

FOREIGN PATENT DOCUMENTS
DE    19710829 A1    9/1998
(Continued)

OTHER PUBLICATIONS
USPTO Non-Final Rejection for U.S. Appl. No. 10/137,497 dated Nov. 5, 2004; 17 pages.
(Continued)

*Primary Examiner* — Joseph Lauture

(57) ABSTRACT

A system includes an analog-to-digital modulator to convert at least one analog input signal into at least one digital output signal. The system also includes a processing device to set an operational order and a quantization level of the analog-to-digital modulator. The analog-to-digital modulator converts the analog input signal into the digital output signal according to the operational order and the quantization level.

17 Claims, 6 Drawing Sheets

U.S. PATENT DOCUMENTS

| | | | |
|---|---|---|---|
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A * | 3/1993 | Walden et al. ................ 341/143 |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,673 A | 9/1993 | Allen et al. |
| 5,248,843 A | 9/1993 | Billings |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerphide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |

| | | | | | |
|---|---|---|---|---|---|
| 5,426,384 A | 6/1995 | May | 5,629,857 A | 5/1997 | Brennan |
| 5,428,319 A | 6/1995 | Marvin et al. | 5,629,891 A | 5/1997 | LeMoncheck et al. |
| 5,430,395 A | 7/1995 | Ichimaru | 5,630,052 A | 5/1997 | Shah |
| 5,430,687 A | 7/1995 | Hung et al. | 5,630,057 A | 5/1997 | Hait |
| 5,430,734 A | 7/1995 | Gilson | 5,630,102 A | 5/1997 | Johnson et al. |
| 5,432,476 A | 7/1995 | Tran | 5,631,577 A | 5/1997 | Freidin et al. |
| 5,438,672 A | 8/1995 | Dey | 5,633,766 A | 5/1997 | Hase et al. |
| 5,440,305 A | 8/1995 | Signore et al. | 5,642,295 A | 6/1997 | Smayling |
| 5,451,887 A | 9/1995 | El-Avat et al. | 5,646,544 A | 7/1997 | Iadanza |
| 5,453,904 A | 9/1995 | Higashiyama et al. | 5,646,901 A | 7/1997 | Sharpe-Geisler et al. |
| 5,455,525 A | 10/1995 | Ho et al. | 5,648,642 A | 7/1997 | Miller et al. |
| 5,455,731 A | 10/1995 | Parkinson | 5,651,035 A | 7/1997 | Tozun |
| 5,455,927 A | 10/1995 | Huang | 5,652,893 A | 7/1997 | Ben-Meir et al. |
| 5,457,410 A | 10/1995 | Ting | 5,661,433 A | 8/1997 | LaRosa et al. |
| 5,457,479 A | 10/1995 | Cheng | 5,663,900 A | 9/1997 | Bhandari et al. |
| 5,463,591 A | 10/1995 | Aimoto et al. | 5,663,965 A | 9/1997 | Seymour |
| 5,479,603 A | 12/1995 | Stone et al. | 5,664,199 A | 9/1997 | Kuwahara |
| 5,479,643 A | 12/1995 | Bhaskar et al. | 5,666,480 A | 9/1997 | Leung et al. |
| 5,479,652 A | 12/1995 | Dreyer et al. | 5,670,915 A | 9/1997 | Cooper et al. |
| 5,481,471 A | 1/1996 | Naglestad | 5,673,198 A | 9/1997 | Lawman et al. |
| 5,486,204 A | 1/1996 | Mead et al. | 5,675,825 A | 10/1997 | Dreyer et al. |
| 5,491,458 A | 2/1996 | McCune | 5,677,691 A | 10/1997 | Hosticka et al. |
| 5,493,246 A | 2/1996 | Anderson | 5,680,070 A | 10/1997 | Anderson et al. |
| 5,493,723 A | 2/1996 | Beck et al. | 5,682,032 A | 10/1997 | Philipp |
| 5,495,077 A | 2/1996 | Miller et al. | 5,684,434 A | 11/1997 | Mann et al. |
| 5,495,593 A | 2/1996 | Elmer et al. | 5,684,952 A | 11/1997 | Stein |
| 5,495,594 A | 2/1996 | MacKenna et al. | 5,686,844 A | 11/1997 | Hull et al. |
| 5,497,119 A | 3/1996 | Tedrow et al. | 5,687,325 A | 11/1997 | Chang |
| 5,499,192 A | 3/1996 | Knapp et al. | 5,689,195 A | 11/1997 | Cliff et al. |
| 5,500,823 A | 3/1996 | Martin et al. | 5,689,196 A | 11/1997 | Schutte |
| 5,517,198 A | 5/1996 | McEwan | 5,691,664 A | 11/1997 | Anderson et al. |
| 5,519,854 A | 5/1996 | Watt | 5,691,898 A | 11/1997 | Rosenberg et al. |
| 5,521,529 A | 5/1996 | Agrawal et al. | 5,694,063 A | 12/1997 | Burlison et al. |
| 5,530,444 A | 6/1996 | Tice et al. | 5,696,952 A | 12/1997 | Pontarelli |
| 5,530,673 A | 6/1996 | Tobita et al. | 5,699,024 A | 12/1997 | Manlove et al. |
| 5,530,813 A | 6/1996 | Paulsen et al. | 5,703,871 A | 12/1997 | Pope et al. |
| 5,537,057 A | 7/1996 | Leong et al. | 5,706,453 A | 1/1998 | Cheng et al. |
| 5,541,878 A | 7/1996 | LeMoncheck et al. | 5,708,589 A | 1/1998 | Beauvais |
| 5,542,055 A | 7/1996 | Amini et al. | 5,708,798 A | 1/1998 | Lynch et al. |
| 5,543,588 A | 8/1996 | Bisset et al. | 5,710,906 A | 1/1998 | Ghosh et al. |
| 5,543,590 A | 8/1996 | Gillespie et al. | 5,712,969 A | 1/1998 | Zimmermann et al. |
| 5,543,591 A | 8/1996 | Gillespie et al. | 5,721,931 A | 2/1998 | Gephardt et al. |
| 5,544,067 A | 8/1996 | Rostoker et al. | 5,724,009 A | 3/1998 | Collins et al. |
| 5,544,311 A | 8/1996 | Harenberg et al. | 5,727,170 A | 3/1998 | Mitchell et al. |
| 5,546,433 A | 8/1996 | Tran et al. | 5,728,933 A | 3/1998 | Schultz et al. |
| 5,546,562 A | 8/1996 | Patel | 5,729,704 A | 3/1998 | Stone et al. |
| 5,552,725 A | 9/1996 | Ray et al. | 5,730,165 A | 3/1998 | Philipp |
| 5,552,748 A | 9/1996 | O'Shaughnessy | 5,732,277 A | 3/1998 | Kodosky et al. |
| 5,554,951 A | 9/1996 | Gough | 5,734,272 A | 3/1998 | Belot et al. |
| 5,555,452 A | 9/1996 | Callaway et al. | 5,734,334 A | 3/1998 | Hsieh et al. |
| 5,555,907 A | 9/1996 | Philipp | 5,737,557 A | 4/1998 | Sullivan |
| 5,557,762 A | 9/1996 | Okuaki et al. | 5,737,760 A | 4/1998 | Grimmer et al. |
| 5,559,502 A | 9/1996 | Schutte | 5,745,011 A | 4/1998 | Scott |
| 5,559,996 A | 9/1996 | Fujioka et al. | 5,748,048 A | 5/1998 | Moyal |
| 5,563,526 A | 10/1996 | Hastings et al. | 5,748,875 A | 5/1998 | Tzori |
| 5,563,529 A | 10/1996 | Seltzer et al. | 5,752,013 A | 5/1998 | Christensen et al. |
| 5,564,010 A | 10/1996 | Henry et al. | 5,754,552 A | 5/1998 | Allmond et al. |
| 5,564,108 A | 10/1996 | Hunsaker et al. | 5,754,826 A | 5/1998 | Gamal et al. |
| 5,565,658 A | 10/1996 | Gerpheide et al. | 5,757,368 A | 5/1998 | Gerpheide et al. |
| 5,566,702 A | 10/1996 | Philipp | 5,758,058 A | 5/1998 | Milburn |
| 5,572,665 A | 11/1996 | Nakabayashi et al. | 5,761,128 A | 6/1998 | Watanabe |
| 5,572,719 A | 11/1996 | Biesterfeldt | 5,763,909 A | 6/1998 | Mead et al. |
| 5,574,678 A | 11/1996 | Gorecki | 5,764,714 A | 6/1998 | Stansell et al. |
| 5,574,852 A | 11/1996 | Bakker et al. | 5,767,457 A | 6/1998 | Gerpheide et al. |
| 5,574,892 A | 11/1996 | Christensen | 5,774,704 A | 6/1998 | Williams |
| 5,579,353 A | 11/1996 | Parmenter et al. | 5,777,399 A | 7/1998 | Shibuya |
| 5,587,945 A | 12/1996 | Lin et al. | 5,781,030 A | 7/1998 | Agrawal et al. |
| 5,587,957 A | 12/1996 | Kowalczyk et al. | 5,781,747 A | 7/1998 | Smith et al. |
| 5,590,354 A | 12/1996 | Klapproth et al. | 5,784,545 A | 7/1998 | Anderson et al. |
| 5,594,388 A | 1/1997 | O'Shaughnessy et al. | 5,790,957 A | 8/1998 | Heidari |
| 5,594,734 A | 1/1997 | Worsley et al. | 5,796,183 A | 8/1998 | Hourmand |
| 5,594,876 A | 1/1997 | Getzlaff et al. | 5,799,176 A | 8/1998 | Kapusta et al. |
| 5,594,890 A | 1/1997 | Yamaura et al. | 5,801,958 A | 9/1998 | Dangelo et al. |
| 5,600,262 A | 2/1997 | Kolze | 5,802,073 A | 9/1998 | Platt |
| 5,604,466 A | 2/1997 | Dreps et al. | 5,802,290 A | 9/1998 | Casselman |
| 5,608,892 A | 3/1997 | Wakerly | 5,805,792 A | 9/1998 | Swoboda et al. |
| 5,614,861 A | 3/1997 | Harada | 5,805,897 A | 9/1998 | Glowny |
| 5,625,316 A | 4/1997 | Chambers et al. | 5,808,883 A | 9/1998 | Hawkes |
| 5,625,583 A | 4/1997 | Hyatt | 5,811,987 A | 9/1998 | Ashmore, Jr. et al. |

| Patent | Date | Inventor |
|---|---|---|
| 5,812,698 A | 9/1998 | Platt et al. |
| 5,818,254 A | 10/1998 | Agrawal et al. |
| 5,818,444 A | 10/1998 | Alimpich et al. |
| 5,818,736 A | 10/1998 | Leibold |
| 5,819,028 A | 10/1998 | Manghirmalani et al. |
| 5,822,387 A | 10/1998 | Mar |
| 5,822,531 A | 10/1998 | Gorczyca et al. |
| 5,828,693 A | 10/1998 | Mays et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,256 A | 12/1998 | Mead et al. |
| 5,844,404 A | 12/1998 | Caser et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,346 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,887,189 A | 3/1999 | Birns et al. |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,909,544 A | 6/1999 | Anderson, II et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | LaGrange et al. |
| 5,917,356 A | 6/1999 | Casal et al. |
| 5,920,310 A | 7/1999 | Faggin et al. |
| 5,923,264 A | 7/1999 | Lavelle et al. |
| 5,926,566 A | 7/1999 | Wang et al. |
| 5,929,710 A | 7/1999 | Bien |
| 5,930,148 A | 7/1999 | Bjorksten et al. |
| 5,930,150 A | 7/1999 | Cohen et al. |
| 5,931,959 A | 8/1999 | Kwiat |
| 5,933,023 A | 8/1999 | Young |
| 5,933,356 A | 8/1999 | Rostoker et al. |
| 5,933,816 A | 8/1999 | Zeanah et al. |
| 5,935,233 A | 8/1999 | Jeddeloh |
| 5,935,266 A | 8/1999 | Thurnhofer et al. |
| 5,939,904 A | 8/1999 | Fetterman et al. |
| 5,939,949 A | 8/1999 | Olgaard et al. |
| 5,941,991 A | 8/1999 | Kageshima |
| 5,942,733 A | 8/1999 | Allen et al. |
| 5,943,052 A | 8/1999 | Allen et al. |
| 5,945,878 A | 8/1999 | Westwick et al. |
| 5,949,632 A | 9/1999 | Barreras, Sr. et al. |
| 5,952,888 A | 9/1999 | Scott |
| 5,956,279 A | 9/1999 | Mo et al. |
| 5,959,871 A | 9/1999 | Pierzchala et al. |
| 5,963,075 A | 10/1999 | Hiiragizawa |
| 5,963,105 A | 10/1999 | Nguyen |
| 5,963,503 A | 10/1999 | Lee |
| 5,964,893 A | 10/1999 | Circello et al. |
| 5,966,027 A | 10/1999 | Kapusta et al. |
| 5,966,532 A | 10/1999 | McDonald et al. |
| 5,968,135 A | 10/1999 | Teramoto et al. |
| 5,969,513 A | 10/1999 | Clark |
| 5,969,632 A | 10/1999 | Diamant et al. |
| 5,973,368 A | 10/1999 | Pearce et al. |
| 5,974,235 A | 10/1999 | Nunally et al. |
| 5,977,791 A | 11/1999 | Veenstra |
| 5,978,584 A | 11/1999 | Nishibata et al. |
| 5,978,937 A | 11/1999 | Miyamori et al. |
| 5,982,105 A | 11/1999 | Masters |
| 5,982,229 A | 11/1999 | Wong et al. |
| 5,982,241 A | 11/1999 | Nguyen et al. |
| 5,983,277 A | 11/1999 | Heile et al. |
| 5,986,479 A | 11/1999 | Mohan |
| 5,987,246 A | 11/1999 | Thomsen et al. |
| 5,988,902 A | 11/1999 | Holehan |
| 5,994,939 A | 11/1999 | Johnson et al. |
| 5,996,032 A | 11/1999 | Baker |
| 5,999,725 A | 12/1999 | Barbier et al. |
| 6,002,268 A | 12/1999 | Sasaki et al. |
| 6,002,398 A | 12/1999 | Wilson |
| 6,003,054 A | 12/1999 | Oshima et al. |
| 6,003,107 A | 12/1999 | Ranson et al. |
| 6,003,133 A | 12/1999 | Moughanni et al. |
| 6,005,814 A | 12/1999 | Mulholland et al. |
| 6,005,904 A | 12/1999 | Knapp et al. |
| 6,008,685 A | 12/1999 | Kunst |
| 6,008,703 A | 12/1999 | Perrott et al. |
| 6,009,270 A | 12/1999 | Mann |
| 6,009,496 A | 12/1999 | Tsai |
| 6,011,407 A | 1/2000 | New |
| 6,012,835 A | 1/2000 | Thompson et al. |
| 6,014,135 A | 1/2000 | Fernandes |
| 6,014,509 A | 1/2000 | Furtek et al. |
| 6,014,723 A | 1/2000 | Tremblay et al. |
| 6,016,554 A | 1/2000 | Skrovan et al. |
| 6,016,563 A | 1/2000 | Fleisher |
| 6,018,559 A | 1/2000 | Azegami et al. |
| 6,023,422 A | 2/2000 | Allen et al. |
| 6,023,565 A | 2/2000 | Lawman et al. |
| 6,026,134 A | 2/2000 | Duffy et al. |
| 6,026,501 A | 2/2000 | Hohl et al. |
| 6,028,271 A | 2/2000 | Gillespie et al. |
| 6,028,959 A | 2/2000 | Wang et al. |
| 6,031,365 A | 2/2000 | Sharpe-Geisler |
| 6,032,268 A | 2/2000 | Swoboda et al. |
| 6,034,538 A | 3/2000 | Abramovici |
| 6,035,320 A | 3/2000 | Kiriaki et al. |
| 6,037,807 A | 3/2000 | Wu et al. |
| 6,038,551 A | 3/2000 | Barlow et al. |
| 6,041,406 A | 3/2000 | Mann |
| 6,043,695 A | 3/2000 | O'Sullivan |
| 6,043,719 A | 3/2000 | Lin et al. |
| 6,049,223 A | 4/2000 | Lytle et al. |
| 6,049,225 A | 4/2000 | Huang et al. |
| 6,051,772 A | 4/2000 | Cameron et al. |
| 6,052,035 A | 4/2000 | Nolan et al. |
| 6,052,524 A | 4/2000 | Pauna |
| 6,055,584 A | 4/2000 | Bridges et al. |
| 6,057,705 A | 5/2000 | Wojewoda et al. |
| 6,058,263 A | 5/2000 | Voth |
| 6,058,452 A | 5/2000 | Rangasayee et al. |
| 6,061,511 A | 5/2000 | Marantz et al. |
| 6,066,961 A | 5/2000 | Lee et al. |
| 6,070,003 A | 5/2000 | Gove et al. |
| 6,072,803 A | 6/2000 | Allmond et al. |
| 6,075,941 A | 6/2000 | Itoh et al. |
| 6,079,985 A | 6/2000 | Wohl et al. |
| 6,081,140 A | 6/2000 | King |
| 6,094,730 A | 7/2000 | Lopez et al. |
| 6,097,211 A | 8/2000 | Couts-Martin et al. |
| 6,097,432 A | 8/2000 | Mead et al. |

| | | | | | | |
|---|---|---|---|---|---|---|
| 6,101,457 | A | 8/2000 | Barch et al. | 6,236,242 | B1 | 5/2001 | Hedberg |
| 6,101,617 | A | 8/2000 | Burckhartt et al. | 6,236,275 | B1 | 5/2001 | Dent |
| 6,104,217 | A | 8/2000 | Magana | 6,236,278 | B1 | 5/2001 | Olgaard |
| 6,104,325 | A | 8/2000 | Liaw et al. | 6,236,593 | B1 | 5/2001 | Hong et al. |
| 6,107,769 | A | 8/2000 | Saylor et al. | 6,239,389 | B1 | 5/2001 | Allen et al. |
| 6,107,826 | A | 8/2000 | Young et al. | 6,239,798 | B1 | 5/2001 | Ludolph et al. |
| 6,107,882 | A | 8/2000 | Gabara et al. | 6,240,375 | B1 | 5/2001 | Sonoda |
| 6,110,223 | A | 8/2000 | Southgate et al. | 6,246,258 | B1 | 6/2001 | Lesea |
| 6,111,431 | A | 8/2000 | Estrada | 6,246,410 | B1 | 6/2001 | Bergeron et al. |
| 6,112,264 | A | 8/2000 | Beasley et al. | 6,249,167 | B1 | 6/2001 | Oguchi et al. |
| 6,121,791 | A | 9/2000 | Abbott | 6,249,447 | B1 | 6/2001 | Boylan et al. |
| 6,121,805 | A | 9/2000 | Thamsirianunt et al. | 6,253,250 | B1 | 6/2001 | Evans et al. |
| 6,121,965 | A | 9/2000 | Kenney et al. | 6,253,754 | B1 | 7/2001 | Rochparvar |
| 6,125,416 | A | 9/2000 | Warren | 6,262,717 | B1 | 7/2001 | Donohue et al. |
| 6,130,548 | A | 10/2000 | Koifman | 6,263,302 | B1 | 7/2001 | Hellestrand et al. |
| 6,130,551 | A | 10/2000 | Agrawal et al. | 6,263,339 | B1 | 7/2001 | Hirsch |
| 6,130,552 | A | 10/2000 | Jefferson et al. | 6,263,484 | B1 | 7/2001 | Yang |
| 6,133,773 | A | 10/2000 | Garlepp et al. | 6,271,679 | B1 | 8/2001 | McClintock et al. |
| 6,134,181 | A | 10/2000 | Landry | 6,272,646 | B1 | 8/2001 | Rangasayee |
| 6,134,516 | A | 10/2000 | Wang et al. | 6,275,117 | B1 | 8/2001 | Abugharbieh et al. |
| 6,137,308 | A | 10/2000 | Nayak | 6,278,568 | B1 | 8/2001 | Cloke et al. |
| 6,140,853 | A | 10/2000 | Lo | 6,280,391 | B1 | 8/2001 | Olson et al. |
| 6,141,376 | A | 10/2000 | Shaw | 6,281,753 | B1 | 8/2001 | Corsi et al. |
| 6,141,764 | A | 10/2000 | Ezell | 6,282,547 | B1 | 8/2001 | Hirsch |
| 6,144,327 | A | 11/2000 | Distinti et al. | 6,282,551 | B1 | 8/2001 | Anderson et al. |
| 6,148,104 | A | 11/2000 | Wang et al. | 6,286,127 | B1 | 9/2001 | King et al. |
| 6,148,441 | A | 11/2000 | Woodward | 6,288,707 | B1 | 9/2001 | Philipp |
| 6,149,299 | A | 11/2000 | Aslan et al. | 6,289,300 | B1 | 9/2001 | Brannick et al. |
| 6,150,866 | A | 11/2000 | Eto et al. | 6,289,478 | B1 | 9/2001 | Kitagaki |
| 6,154,064 | A | 11/2000 | Proebsting | 6,289,489 | B1 | 9/2001 | Bold et al. |
| 6,157,024 | A | 12/2000 | Chapdelaine et al. | 6,292,028 | B1 | 9/2001 | Tomita |
| 6,157,270 | A | 12/2000 | Tso | 6,294,932 | B1 | 9/2001 | Watarai |
| 6,161,199 | A | 12/2000 | Szeto et al. | 6,294,952 | B1 | 9/2001 | Mar |
| 6,165,367 | A | 12/2000 | Cho | 6,298,320 | B1 | 10/2001 | Buckmaster et al. |
| 6,166,960 | A | 12/2000 | Marneweck et al. | 6,304,014 | B1 | 10/2001 | England et al. |
| 6,167,077 | A | 12/2000 | Ducaroir | 6,304,101 | B1 | 10/2001 | Nishihara |
| 6,167,364 | A | 12/2000 | Stellenberg et al. | 6,304,790 | B1 | 10/2001 | Nakamura et al. |
| 6,167,559 | A | 12/2000 | Furtek et al. | 6,307,413 | B1 | 10/2001 | Dalmia et al. |
| 6,169,383 | B1 | 1/2001 | Sabin et al. | 6,310,521 | B1 | 10/2001 | Dalmia |
| 6,172,428 | B1 | 1/2001 | Jordan | 6,310,611 | B1 | 10/2001 | Caldwell |
| 6,172,571 | B1 | 1/2001 | Moyal | 6,311,149 | B1 | 10/2001 | Ryan et al. |
| 6,173,419 | B1 | 1/2001 | Barnett | 6,314,530 | B1 | 11/2001 | Mann |
| 6,175,914 | B1 | 1/2001 | Mann | 6,320,184 | B1 | 11/2001 | Winklhofer et al. |
| 6,175,949 | B1 | 1/2001 | Gristede et al. | 6,320,282 | B1 | 11/2001 | Caldwell |
| 6,181,163 | B1 | 1/2001 | Agrawal et al. | 6,321,369 | B1 | 11/2001 | Heile et al. |
| 6,183,131 | B1 | 2/2001 | Holloway et al. | 6,323,846 | B1 | 11/2001 | Westerman et al. |
| 6,185,127 | B1 | 2/2001 | Myers et al. | 6,324,628 | B1 | 11/2001 | Chan |
| 6,185,450 | B1 | 2/2001 | Seguine et al. | 6,326,859 | B1 | 12/2001 | Goldman et al. |
| 6,185,522 | B1 | 2/2001 | Bakker | 6,332,137 | B1 | 12/2001 | Hori et al. |
| 6,185,703 | B1 | 2/2001 | Guddat et al. | 6,332,201 | B1 | 12/2001 | Chin et al. |
| 6,185,732 | B1 | 2/2001 | Mann et al. | 6,337,579 | B1 | 1/2002 | Mochida |
| 6,186,228 | B1 | 2/2001 | Philipp | 6,338,109 | B1 | 1/2002 | Snyder et al. |
| 6,186,361 | B1 | 2/2001 | van der Wal et al. | 6,339,815 | B1 | 1/2002 | Feng et al. |
| 6,188,241 | B1 | 2/2001 | Gauthier et al. | 6,342,907 | B1 | 1/2002 | Petty et al. |
| 6,188,391 | B1 | 2/2001 | Seely et al. | 6,345,383 | B1 | 2/2002 | Ueki |
| 6,188,975 | B1 | 2/2001 | Gay | 6,347,395 | B1 | 2/2002 | Payne et al. |
| 6,191,603 | B1 | 2/2001 | Muradali et al. | 6,351,789 | B1 | 2/2002 | Green |
| 6,191,660 | B1 | 2/2001 | Mar et al. | 6,353,452 | B1 | 3/2002 | Hamada et al. |
| 6,191,998 | B1 | 2/2001 | Reddy et al. | 6,355,980 | B1 | 3/2002 | Callahan |
| 6,192,431 | B1 | 2/2001 | Dabral et al. | 6,356,862 | B2 | 3/2002 | Bailey |
| 6,198,303 | B1 | 3/2001 | Rangasayee | 6,356,958 | B1 | 3/2002 | Lin |
| 6,201,407 | B1 | 3/2001 | Kapusta et al. | 6,356,960 | B1 | 3/2002 | Jones et al. |
| 6,201,829 | B1 | 3/2001 | Schneider | 6,359,950 | B2 | 3/2002 | Gossmann et al. |
| 6,202,044 | B1 | 3/2001 | Tzori | 6,362,697 | B1 | 3/2002 | Pulvirenti |
| 6,204,687 | B1 | 3/2001 | Schultz et al. | 6,366,174 | B1 | 4/2002 | Berry et al. |
| 6,205,574 | B1 | 3/2001 | Dellinger et al. | 6,366,300 | B1 | 4/2002 | Ohara et al. |
| 6,208,572 | B1 | 3/2001 | Adams et al. | 6,366,874 | B1 | 4/2002 | Lee et al. |
| 6,211,708 | B1 | 4/2001 | Klemmer | 6,366,878 | B1 | 4/2002 | Grunert |
| 6,211,715 | B1 | 4/2001 | Terauchi | 6,369,660 | B1 | 4/2002 | Wei |
| 6,211,741 | B1 | 4/2001 | Dalmia | 6,371,878 | B1 | 4/2002 | Bowen |
| 6,215,352 | B1 | 4/2001 | Sudo | 6,373,954 | B1 | 4/2002 | Malcolm et al. |
| 6,216,254 | B1 | 4/2001 | Pesce et al. | 6,374,370 | B1 | 4/2002 | Bockhaus et al. |
| 6,219,729 | B1 | 4/2001 | Keats et al. | 6,377,009 | B1 | 4/2002 | Philipp |
| 6,222,528 | B1 | 4/2001 | Gerpheide et al. | 6,377,575 | B1 | 4/2002 | Mullaney et al. |
| 6,223,144 | B1 | 4/2001 | Barnett et al. | 6,377,646 | B1 | 4/2002 | Sha |
| 6,223,147 | B1 | 4/2001 | Bowers | 6,380,811 | B1 | 4/2002 | Zarubinsky et al. |
| 6,223,272 | B1 | 4/2001 | Coehlo et al. | 6,380,929 | B1 | 4/2002 | Platt |
| RE37,195 | E | 5/2001 | Kean | 6,380,931 | B1 | 4/2002 | Gillespie et al. |
| 6,225,866 | B1 | 5/2001 | Kubota et al. | 6,384,947 | B1 | 5/2002 | Ackerman et al. |

| | | |
|---|---|---|
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Sun et al. |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamashi/Rab et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Roy et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,546,297 B1 | 4/2003 | Gaston et al. |
| 6,552,933 B2 | 4/2003 | Roohparvar |
| 6,553,057 B1 | 4/2003 | Sha |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 * | 6/2003 | Ruha et al. .................. 341/143 |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,799 B1 | 7/2003 | Robertson et al. |
| 6,597,212 B1 | 7/2003 | Wang et al. |
| 6,597,824 B1 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |

| | | | | | | |
|---|---|---|---|---|---|---|
| 6,661,724 B1 | 12/2003 | Snyder et al. | | 6,798,299 B1 | 9/2004 | Mar et al. |
| 6,664,978 B1 | 12/2003 | Kekic et al. | | 6,799,198 B1 | 9/2004 | Huboi et al. |
| 6,664,991 B1 | 12/2003 | Chew et al. | | 6,806,771 B1 | 10/2004 | Hildebrant et al. |
| 6,667,642 B1 | 12/2003 | Moyal | | 6,806,782 B2 | 10/2004 | Motoyoshi et al. |
| 6,667,740 B2 | 12/2003 | Ely et al. | | 6,809,275 B1 | 10/2004 | Cheng et al. |
| 6,670,852 B1 | 12/2003 | Hauck | | 6,809,566 B1 | 10/2004 | Xin-LeBlanc |
| 6,671,869 B2 | 12/2003 | Davidson et al. | | 6,810,442 B1 | 10/2004 | Lin et al. |
| 6,673,308 B2 | 1/2004 | Hino et al. | | 6,815,979 B2 | 11/2004 | Ooshita |
| 6,677,814 B2 | 1/2004 | Low et al. | | 6,816,544 B1 | 11/2004 | Bailey et al. |
| 6,677,932 B1 | 1/2004 | Westerman | | 6,817,005 B2 | 11/2004 | Mason et al. |
| 6,678,645 B1 | 1/2004 | Rajsuman et al. | | 6,819,142 B1 | 11/2004 | Viehmann et al. |
| 6,678,877 B1 | 1/2004 | Perry et al. | | 6,823,282 B1 | 11/2004 | Snyder |
| 6,680,632 B1 | 1/2004 | Meyers et al. | | 6,823,497 B2 | 11/2004 | Schubert et al. |
| 6,680,731 B2 | 1/2004 | Gerpheide et al. | | 6,825,689 B1 | 11/2004 | Snyder |
| 6,681,280 B1 | 1/2004 | Miyake et al. | | 6,825,869 B2 | 11/2004 | Bang |
| 6,681,359 B1 | 1/2004 | Au et al. | | 6,828,824 B1 | 12/2004 | Betz et al. |
| 6,683,462 B2 | 1/2004 | Shimizu | | 6,829,727 B1 | 12/2004 | Pawloski |
| 6,683,930 B1 | 1/2004 | Dalmia | | 6,834,384 B2 | 12/2004 | Fiorella, II et al. |
| 6,686,787 B2 | 2/2004 | Ling | | 6,836,169 B2 | 12/2004 | Richmond et al. |
| 6,686,860 B2 | 2/2004 | Gulati et al. | | 6,839,774 B1 | 1/2005 | Ahn et al. |
| 6,690,224 B1 | 2/2004 | Moore | | 6,842,710 B2 | 1/2005 | Gehring et al. |
| 6,691,193 B1 | 2/2004 | Wang et al. | | 6,847,203 B1 | 1/2005 | Conti et al. |
| 6,691,301 B2 | 2/2004 | Bowen | | 6,850,117 B2 | 2/2005 | Weber et al. |
| 6,697,754 B1 | 2/2004 | Alexander | | 6,850,554 B1 | 2/2005 | Sha |
| 6,701,340 B1 | 3/2004 | Gorecki | | 6,853,598 B2 | 2/2005 | Chevallier |
| 6,701,487 B1 | 3/2004 | Ogami et al. | | 6,854,067 B1 | 2/2005 | Kutz et al. |
| 6,701,508 B1 | 3/2004 | Bartz et al. | | 6,856,433 B2 | 2/2005 | Hatano et al. |
| 6,703,961 B2 | 3/2004 | Mueck et al. | | 6,859,884 B1 | 2/2005 | Sullam |
| 6,704,381 B1 | 3/2004 | Moyal et al. | | 6,862,240 B2 | 3/2005 | Burgan |
| 6,704,879 B1 | 3/2004 | Parrish | | 6,864,710 B1 | 3/2005 | Lacey et al. |
| 6,704,889 B2 | 3/2004 | Veenstra et al. | | 6,865,429 B1 | 3/2005 | Schneider et al. |
| 6,704,893 B1 | 3/2004 | Bauwens et al. | | 6,865,504 B2 | 3/2005 | Larson et al. |
| 6,705,511 B1 | 3/2004 | Dames et al. | | 6,868,500 B1 | 3/2005 | Kutz et al. |
| 6,711,226 B1 | 3/2004 | Williams et al. | | 6,871,253 B2 | 3/2005 | Greeff et al. |
| 6,711,731 B2 | 3/2004 | Weiss | | 6,871,331 B1 | 3/2005 | Bloom et al. |
| 6,713,897 B2 | 3/2004 | Caldwell | | 6,873,203 B1 | 3/2005 | Latham, II et al. |
| 6,714,066 B2 | 3/2004 | Gorecki et al. | | 6,873,210 B2 | 3/2005 | Mulder et al. |
| 6,714,817 B2 | 3/2004 | Daynes et al. | | 6,876,941 B2 | 4/2005 | Nightingale |
| 6,715,132 B1 | 3/2004 | Bartz et al. | | 6,880,086 B2 | 4/2005 | Kidder et al. |
| 6,717,474 B2 | 4/2004 | Chen et al. | | 6,888,453 B2 | 5/2005 | Lutz et al. |
| 6,718,294 B1 | 4/2004 | Bartfeld | | 6,888,538 B2 | 5/2005 | Ely et al. |
| 6,718,520 B1 | 4/2004 | Merryman et al. | | 6,892,310 B1 | 5/2005 | Kutz et al. |
| 6,718,533 B1 | 4/2004 | Schneider et al. | | 6,892,322 B1 | 5/2005 | Snyder |
| 6,724,220 B1 | 4/2004 | Snyder et al. | | 6,893,724 B2 | 5/2005 | Lin et al. |
| 6,725,441 B1 | 4/2004 | Keller et al. | | 6,894,928 B2 | 5/2005 | Owen |
| 6,728,900 B1 | 4/2004 | Meli | | 6,897,390 B2 | 5/2005 | Caldwell et al. |
| 6,728,902 B2 | 4/2004 | Kaiser et al. | | 6,898,703 B1 | 5/2005 | Ogami et al. |
| 6,730,863 B1 | 5/2004 | Gerpheide | | 6,900,663 B1 | 5/2005 | Roper et al. |
| 6,731,552 B2 | 5/2004 | Perner | | 6,901,014 B2 | 5/2005 | Son et al. |
| 6,732,068 B2 | 5/2004 | Sample et al. | | 6,901,563 B1 | 5/2005 | Ogami et al. |
| 6,732,347 B1 | 5/2004 | Camilleri et al. | | 6,903,402 B2 | 6/2005 | Miyazawa |
| 6,738,858 B1 | 5/2004 | Fernald et al. | | 6,903,613 B1 | 6/2005 | Mitchell et al. |
| 6,744,323 B1 | 6/2004 | Moyal et al. | | 6,904,570 B2 | 6/2005 | Foote et al. |
| 6,745,369 B1 | 6/2004 | May et al. | | 6,910,126 B1 | 6/2005 | Mar et al. |
| 6,748,569 B1 | 6/2004 | Brooke et al. | | 6,911,857 B1 | 6/2005 | Stiff |
| 6,750,852 B2 | 6/2004 | Gillespie | | 6,917,661 B1 | 7/2005 | Scott et al. |
| 6,750,876 B2 | 6/2004 | Atsatt et al. | | 6,922,821 B1 | 7/2005 | Nemecek |
| 6,750,889 B1 | 6/2004 | Livingston et al. | | 6,924,658 B2 | 8/2005 | Muller et al. |
| 6,754,101 B2 | 6/2004 | Terzioglu et al. | | 6,934,674 B1 | 8/2005 | Douezy et al. |
| 6,754,723 B2 | 6/2004 | Kato | | 6,937,075 B2 | 8/2005 | Lim et al. |
| 6,754,765 B1 | 6/2004 | Chang et al. | | 6,940,356 B2 | 9/2005 | McDonald et al. |
| 6,754,849 B2 | 6/2004 | Tamura | | 6,941,336 B1 | 9/2005 | Mar |
| 6,757,882 B2 | 6/2004 | Chen et al. | | 6,941,538 B2 | 9/2005 | Hwang et al. |
| 6,765,407 B1 | 7/2004 | Snyder | | 6,944,018 B2 | 9/2005 | Caldwell |
| 6,768,337 B2 | 7/2004 | Kohno et al. | | 6,949,811 B2 | 9/2005 | Miyazawa |
| 6,768,352 B1 | 7/2004 | Maher et al. | | 6,949,984 B2 | 9/2005 | Siniscalchi |
| 6,769,622 B1 | 8/2004 | Tournemille et al. | | 6,950,954 B1 | 9/2005 | Sullam et al. |
| 6,771,552 B2 | 8/2004 | Fujisawa | | 6,950,990 B2 | 9/2005 | Rajarajan et al. |
| 6,774,644 B2 | 8/2004 | Eberlein | | 6,952,778 B1 | 10/2005 | Snyder |
| 6,781,456 B2 | 8/2004 | Pradhan | | 6,954,511 B2 | 10/2005 | Tachimori |
| 6,782,068 B1 | 8/2004 | Wilson et al. | | 6,954,904 B2 | 10/2005 | White |
| 6,784,821 B1 | 8/2004 | Lee | | 6,956,419 B1 | 10/2005 | Mann et al. |
| 6,785,881 B1 | 8/2004 | Bartz et al. | | 6,957,180 B1 | 10/2005 | Nemecek |
| 6,788,116 B1 | 9/2004 | Cook et al. | | 6,957,242 B1 | 10/2005 | Snyder |
| 6,788,221 B1 | 9/2004 | Ely et al. | | 6,961,686 B2 | 11/2005 | Kodosky et al. |
| 6,788,521 B2 | 9/2004 | Nishi | | 6,963,233 B2 | 11/2005 | Puccio et al. |
| 6,791,377 B2 | 9/2004 | Ilchmann et al. | | 6,963,908 B1 | 11/2005 | Lynch et al. |
| 6,792,584 B1 | 9/2004 | Eneboe et al. | | 6,966,039 B1 | 11/2005 | Bartz et al. |
| 6,798,218 B2 | 9/2004 | Kasperkovitz | | 6,967,511 B1 | 11/2005 | Sullam |

| | | |
|---|---|---|
| 6,967,960 B1 | 11/2005 | Bross et al. |
| 6,968,346 B2 | 11/2005 | Hekmatpour |
| 6,969,978 B2 | 11/2005 | Dening |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,975,123 B2 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | McCubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek |
| 7,100,133 B1 | 8/2006 | Meiyappan et al. |
| 7,103,108 B1 | 9/2006 | Beard |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 * | 10/2006 | Kawamura ............... 341/143 |
| 7,132,835 B1 | 11/2006 | Arcus |
| 7,133,140 B2 | 11/2006 | Lukacs et al. |
| 7,133,793 B2 | 11/2006 | Ely et al. |
| 7,138,841 B1 | 11/2006 | Li |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Andrade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | McLeod |
| 7,282,905 B2 | 10/2007 | Chen et al. |
| 7,283,151 B2 | 10/2007 | Nihei et al. |
| 7,283,410 B2 | 10/2007 | Hsu et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,610 B1 | 12/2007 | Miller et al. |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,332,976 B1 | 2/2008 | Brennan |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,461,274 B2 | 12/2008 | Merkin |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 7,809,545 B2 | 10/2010 | Ciofi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0015706 A1 | 2/2002 | Cook et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll, Jr. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |

| | | | |
|---|---|---|---|
| 2002/0174411 | A1 | 11/2002 | Feng et al. |
| 2002/0191029 | A1 | 12/2002 | Gillespie et al. |
| 2003/0011639 | A1 | 1/2003 | Webb |
| 2003/0014447 | A1 | 1/2003 | White |
| 2003/0025734 | A1 | 2/2003 | Boose et al. |
| 2003/0033588 | A1 | 2/2003 | Alexander |
| 2003/0041235 | A1 | 2/2003 | Meyer |
| 2003/0056071 | A1 | 3/2003 | Triece et al. |
| 2003/0058469 | A1 | 3/2003 | Buis et al. |
| 2003/0061572 | A1 | 3/2003 | McClannahan et al. |
| 2003/0062889 | A1 | 4/2003 | Ely et al. |
| 2003/0066057 | A1 | 4/2003 | RuDusky |
| 2003/0080755 | A1 | 5/2003 | Kobayashi |
| 2003/0086300 | A1 | 5/2003 | Noyes et al. |
| 2003/0097640 | A1 | 5/2003 | Abrams et al. |
| 2003/0105620 | A1 | 6/2003 | Bowen |
| 2003/0126947 | A1 | 7/2003 | Margaria |
| 2003/0135842 | A1 | 7/2003 | Frey et al. |
| 2003/0149961 | A1 | 8/2003 | Kawai et al. |
| 2003/0229482 | A1 | 12/2003 | Cook et al. |
| 2004/0018711 | A1 | 1/2004 | Madurawe |
| 2004/0054821 | A1 | 3/2004 | Warren et al. |
| 2004/0153802 | A1 | 8/2004 | Kudo et al. |
| 2004/0205553 | A1 | 10/2004 | Hall et al. |
| 2004/0205617 | A1 | 10/2004 | Light |
| 2004/0205695 | A1 | 10/2004 | Fletcher |
| 2005/0024341 | A1 | 2/2005 | Gillespie et al. |
| 2005/0066152 | A1 | 3/2005 | Garey |
| 2005/0143968 | A9 | 6/2005 | Odom et al. |
| 2005/0240917 | A1 | 10/2005 | Wu |
| 2005/0248534 | A1 | 11/2005 | Kehlstadt |
| 2005/0280453 | A1 | 12/2005 | Hsieh |
| 2006/0015862 | A1 | 1/2006 | Odom et al. |
| 2006/0031768 | A1 | 2/2006 | Shah et al. |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1 | 6/2007 | Reblewski |
| 2007/0258458 | A1 | 11/2007 | Kapoor |
| 2008/0086668 | A1 | 4/2008 | Jefferson et al. |
| 2008/0095213 | A1 | 4/2008 | Lin et al. |
| 2008/0186052 | A1 | 8/2008 | Needham et al. |
| 2008/0259998 | A1 | 10/2008 | Venkataraman et al. |
| 2008/0294806 | A1 | 11/2008 | Swindle et al. |
| 2009/0066427 | A1 | 3/2009 | Brennan |
| 2009/0322305 | A1 | 12/2009 | De Cremoux |

FOREIGN PATENT DOCUMENTS

| | | | |
|---|---|---|---|
| EP | 0308583 | A2 | 3/1989 |
| EP | 366398 | A1 | 5/1990 |
| EP | 0450863 | A2 | 10/1991 |
| EP | 0499393 | A2 | 8/1992 |
| EP | 0639816 | A2 | 2/1995 |
| EP | 1170671 | A1 | 1/2002 |
| EP | 1205848 | A1 | 5/2002 |
| EP | 1191423 | A2 | 2/2003 |
| JP | 404083405 | A1 | 3/1992 |
| JP | 405055842 | A1 | 3/1993 |
| JP | 06021732 | A1 | 1/1994 |
| JP | 404095408 | A1 | 3/2002 |
| WO | 9532478 | A1 | 11/1995 |
| WO | PCT/US96/17305 | A1 | 6/1996 |
| WO | PCT/US98/34376 | A1 | 8/1998 |
| WO | PCT/US99/09712 | A1 | 2/1999 |

OTHER PUBLICATIONS

USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
USPTO U.S. Appl. No. 10/653,050; "Method and System for Programming a Memory Device," Snyder et al.; filed Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
USPTO U.S. Appl. No. 10/172,670; "Method and System for Programming a Memory Device," Snyder et al.; filed Jun. 13, 2002; 66 pages.
USPTO U.S. Appl. No. 11/956,338; Reconfigurable Testing System and Method. Pleis et al., filed Nov. 20, 2007; 41 pages.
USPTO Notice of Allowance for U.S. Appl. No. 11/955,291 dated May 5, 2009; 7 pages.
USPTO Non-Final Rejection for U.S. Appl. No. 11/965,291 dated Dec. 17, 2008; 8 pages.
USPTO U.S. Appl. No. 11/965,291; "Universal Digital Block Interconnection and Channnel Routing," Snyder et al., filed Dec. 27, 2007; 31 pages.
USPTO Notice of Allowance for U.S. Appl. No. 11/986,338 dated May 7, 2009; 1 page.
USPTO U.S. Appl. No. 11/273,708; "Capacitance Sensor Using Relaxation Oscillators," Synder et al., filed Nov. 14, 2005; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO U.S. Appl. No. 11/337,272; "Successive Approximate Capacitance Measurement Circuit;" Warren Snyder, filed Jan. 20, 2006; 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
USPTO U.S. Appl. No. 11/983,291; "Successive Approximate Capacitance Measurement Circuit," Warren Snyder, filed on Nov. 7, 2007; 26 pages.
USPTO Non-Final Rejection for U.S. Appl. No. 11/983,291 dated Mar. 9, 2009; 9 pages.
USPTO U.S. Appl. No. 11/698,660; "Configurable Bus," Kutz et al., filed on Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO U.S. Appl. No. 11/709,866; "Input/Output Multiplexer Bus," Dennis Sequine, filed Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, 1991, Oxford University Press, Feb. 5, 2007; 20 pages.
Van Ess, David; "Simulating a 555 Timer with PSoC," Cypress Semiconductor Corporation, Application Note AN2286, May 19, 2005; 10 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "CY8C21x34 Data Sheet," CSR User Module, CSR V.1.0; Oct. 6, 2005; 36 pages.

Chapweske, Adam; "The PS/2 Mouse Interface," PS/2 Mouse Interfacing, 2001, retrieved on May 18, 2006; 11 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Sequine, Ryan; "Layout Guidelines for PSoC CapSense," Cypress Semiconductor Corporation, Application Note AN2292; Jul. 22, 2005; 13 pages.

Lee, Mark; "EMC Design Considerations for PSoC CapSense Applications," Cypress Semiconductor Corporation, Application Note AN2318; Sep. 16, 2005; 6 pages.

Cypress Semiconductor Corporation, "Release Notes sm017," Jan. 24, 2007; 3 pages.

Cypress Semiconductor Corporation, "PSoC CY8C20x34 Technical Reference Manual (TRM)," PSoC CY8C20x34 TRM, Version 1.0, 2006; 220 pages.

USPTO U.S. Appl. No. 11/166,622; "Touch wake for electronic devices," Beard et al., filed on Jun. 23, 2005; 22 pages.

International Written Opinion of the International Searching Authority for International Application No. PCT/US2006/09572 dated Jan. 10, 2008; 5 pages.

International Search Report for International Application No. PCT/US2006/09572 dated Jan. 10, 2008, 2 pages.

USPTO Notice of Allowance for U.S. Appl. No. 10/024,093 dated Sep. 10, 2002; 7 pages.

USPTO U.S. Appl. No. 10/024,093; "Configurable Memory for Programmable Logic Circuits," Lacey et al., filed Dec. 18, 2001; 25 pages.

USPTO U.S. Appl. No. 10/088,028; "Method and Circuit for Rapid Alignment of Signals," Moral et al., filed Nov. 13, 2007; 34 pages.

USPTO Notice of Allowance for U.S. Appl. No. 11/088,028 dated Jul. 2, 2007; 6 pages.

USPTO Notice of Allowance for U.S. Appl. No. 11/088,028 dated Jan. 26, 2007; 6 pages.

USPTO Non-Final Rejection for U.S. Appl. No. 11/088,028 dated Jun. 16, 2006; 8 pages.

USPTO U.S. Appl. No. 11/985,340; "Method and Circuit for Rapid Alignment of Signals," Moyal et al., filed Nov. 13, 2007; 34 pages.

USPTO Notice of Allowance for U.S. Appl. No. 11/985,340 dated Jun. 2, 2009; 7 pages.

USPTO Requirement for Restriction for U.S. Appl. No. 11/985,340 dated Mar. 16, 2009; 7 pages.

USPTO Non-Final Rejection for U.S. Appl. No. 11/865,572 dated Jul. 17, 2009; 6 pages.

USPTO Non-Final Rejection for U.S. Appl. No. 11/859,547 dated Oct. 1, 2009; 9 pages.

USPTO Non-Final Rejection for U.S. Appl. No. 11/967,243 dated Sep. 17, 2009; 9 pages.

USPTO Non-Final Rejection for U.S. Appl. No. 11/967,240 dated Jun. 10, 2009; 7 pages.

USPTO Non-Final Rejection for U.S. Appl. No. 11/857,947 dated Mar. 30, 2009; 18 pages.

USPTO Non-Final Rejection for U.S. Appl. No. 12/104,672 dated Aug. 26, 2009; 11 pages.

Written Opinion of the Internaitonal Searching Authority for International Applicaiton No. PCT/US08/60695 dated Sep. 22, 2008; 4 pages.

International Search Report of the International Searching Authority for International Applicaiton No. PCT/US08/60695 dated Jul. 22, 2009; 3 pages.

Written Opinion of the International Searching Authority for International Application No. PCT/US08/60695 dated Jul. 22, 2009; 6 pages.

Azim et al., "A Custom DSP Chip to Implement a Robot Motion Controller Proceedings of the IEEE Custom Integrated Circuits Conference," May 1988, pp. 8.7.1-8.7.5; 6 pages.

Catthoor et al., "Architectural Strategies for an Application-Specific Synchronous Multiprocessor Environment," IEEE transaction on Acoustics, Speech, and Signal Processing; vol. 36, No. 2, Feb. 1988, pp. 265-284; 20 pages.

International Search Report of the International Searching Authority for International Application No. PCT/US08/60695 dated Sep. 22, 2008; 2 pages.

International Search Report of the International Searching Authority for International Application No. PCT/US08/60698 dated Sep. 5, 2008; 2 pages.

Scahbahrami et al., "Matrix Register File and Extended Subwords; Two Techniques for Embedded Media Processors," ACM, May 2005; 9 pages.

Jung et al., "A Register File with Transposed Access Mode," 2000, IEEE; 2 pages.

International Search Report of the International Searching Authority for International Application No. PCT/US08/60681 dated Sep. 12, 2008; 2 pages.

Written Opinion of the International Searching Authority for International Application No. PCT/US08/60681 dated Sep. 12, 2008; 4 pages.

USPTO Notice of Allowance for U.S. Appl. No. 11/965,677 dated Sep. 10, 2009; 6 pages.

USPTO Non-Final Rejection for U.S. Appl. No. 11/965,677 dated Mar. 10, 2009; 10 pages.

USPTO Notice of Allowance for U.S. Appl. No. 10/238,966 dated Jun. 5, 2009; 5 pages.

USPTO Notice of Allowance for U.S. Appl. No. 10/033,027 dated Sep. 2, 2009; 4 pages.

USPTO Non-Final Rejection for U.S. Appl. No. 10/001,478 dated Jun. 4, 2009; 17 pages.

USPTO Advisory Action for U.S. Appl. No. 10/001,478 dated Jun. 30, 2009; 3 pages.

USPTO Final Rejection for U.S. Appl. No. 10/001,478 dated Apr. 20, 2009; 16 pages.

USPTO Notice of Allowance for U.S. Appl. No. 10/002,217 dated Sep. 17, 2009; 6 pages.

USPTO Notice of Allowance for U.S. Appl. No. 10/002,217 dated Jun. 8, 2009; 8 pages.

USPTO Notice of Allowance for U.S. Appl. No. 10/001,477 dated Dec. 4, 2009; 7 pages.

USPTO Notice of Allowance for U.S. Appl. No. 10/001,477 dated Aug. 26, 2009; 6 pages.

USPTO Ex Parte Quayle Action for U.S. Appl. No. 09/975,115 dated Aug. 20, 2009; 7 pages.

USPTO Non-Final Rejection for U.S. Appl. No. 09/994,601 dated Jul. 9, 2009; 11 pages.

USPTO Non-Final Rejection for U.S. Appl. No. 11/818,005 dated Nov. 23, 2009; 8 pages.

USPTO Requirement for Restriction/Election for U.S. Appl. No. 11/818,005 dated Jul. 14, 2009; 5 pages.

USPTO Advisory Action for U.S. Appl. No. 09/988,778 dated Jun. 17, 2009; 3 pages.

USPTO Notice of Allowance for U.S. Appl. No. 09/994,600 dated Aug. 25, 2009; 4 pages.

USPTO Notice of Allowance for U.S. Appl. No. 09/994,600 dated Apr. 3, 2009; 5 pages.

USPTO Notice of Allowance for U.S. Appl. No. 09/989,762 dated Oct. 30, 2009; 8 pages.

USPTO Notice of Allowance for U.S. Appl. No. 09/989,762 dated Jul. 16, 2009; 5 pages.

USPTO Non-Final Rejection for U.S. Appl. No. 09/998,848 dated May 12, 2009; 16 pages.

USPTO Non-Final Rejection for U.S. Appl. No. 09/989,767 dated May 12, 2009; 21 pages.

USPTO Final Rejection for U.S. Appl. No. 09/989,771 dated Nov. 25, 2009; 12 pages.

USPTO Notice of Allowance for U.S. Appl. No. 09/989,765 dated Sep. 3, 2009; 7 pages.

USPTO Non-Final Rejection for U.S. Appl. No. 09/989,782 dated Oct. 27, 2009; 9 pages.

USPTO Final Rejection for U.S. Appl. No. 09/989,782 dated May 15, 2009; 10 pages.

USPTO Notice of Allowance for U.S. Appl. No. 11/986,338 dated Oct. 19, 2009; 4 pages.

USPTO Notice of Allowance for U.S. Appl. No. 09/989,777 dated Aug. 6, 2009; 8 pages.

USPTO Notice of Allowance for U.S. Appl. No. 10/008,096 dated Oct. 21, 2009; 6 pages.
USPTO Notice of Allowance for U.S. Appl. No. 10/008,095 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 3, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct, 7, 2009; 12 pages.
USPTO Advisory Action for U.S. Appl. No. 11/698,650 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 09/989,767 dated Dec. 7, 2009; 22 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2006; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/998,767 dated Jan. 11, 2007; 12 pages.
USPTO Final Rejection for U.S. Appl. No. 09/998,767 dated Jan. 15, 2009; 21 pages.
USPTO Final Rejection for U.S. Appl. No. 09/998,767 dated Mar. 6, 2006; 15 pages.
USPTO Final Rejection for U.S. Appl. No. 09/998,767 dated Apr. 6, 2005; 13 pages.
USPTO Final Rejection for U.S. Appl. No. 09/998,767 dated Dec. 27, 2007; 21 pages.
USPTO Non-Final Rejection for U.S. Appl. No. 09/998,767 dated Jul. 17, 2006; 12 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2008; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.
USPTO Notice of Allowance for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Notice of Allowance for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2006; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for U.S. Appl. No. 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Notice of Allowance for U.S. Appl. No. 09/994,600 dated May 4, 2005; 18 pages.
USPTO Non-Final Rejection for U.S. Appl. No. 09/994,600 dated Oct. 21, 2004; 37 pages.
USPTO Notice of Allowance for U.S. Appl. No. 10/001,477 dated Nov. 10, 2008; 7 pages.
USPTO Final Rejection for U.S. Appl. No. 10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2005; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.

Julio Faura et al.; "A Novel Mixed Signal Programmable Device with On-Chip Microprocessor", 1997, IEEE 1997 Custom Integrated Circuits Conference; 4 pages.

Monte Mar, Bert Sullam, Eric Blom; "An architecture for a configurable Mixed-signal device", 2003, IEEE Journal of Solid-State Circuits, vol. 3; 4 pages.

Robinson, Gordon D; "Why 1149.1 (JTAG) Really Works", May 1994, Conference Proceedings Electro/94 International, May 10-12, 1994, Combined Volumes; 6 pages.

USPTO Non-Final Rejection for U.S. Appl. No. 09/994,601 dated Oct. 4, 2007; 20 pages.

"PSoC designer: Integrated development environment, getting started 25-minute tutorial, version 1.0", Cypress Microsystems, Cypress Microsystems, Inc. CMS100064A, Jul. 3, 2001; 25 pages.

"PSoC technology complete changes 8-bit MCU system design", Cypress Microsystems, Inc. retrieved from <http://www.archive.org/web/20010219005250/http://cypressmicro.com~/t...>, Feb. 19, 2001; 21 pages.

Specks et al., "A Mixed Digital-Analon 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.

Hsieh et al., "Modeling Micro-Controller Peripherals for High-Level Co-Simulation and Synthesis," IEEE, 1997; 4 pages.

USPTO Notice of Allowance for U.S. Appl. No. 09/989,777 dated Nov. 4, 2008; 3 pages.

USPTO Notice of Allowance for U.S. Appl. No. 09/989,777 dated Sep. 15, 2008; 28 pages.

USPTO Notice of Allowance for U.S. Appl. No. 09/989,777 dated Jul. 7, 2008; 23 pages.

USPTO Final Rejection for U.S. Appl. No. 09/989,777 dated Jan. 30, 2006; 14 pages.

USPTO Non-Final Rejection for U.S. Appl. No. 09/989,777 dated Sep. 11, 2007; 18 pages.

USPTO Final Rejection for U.S. Appl. No. 09/989,777 dated Mar. 13, 2007; 24 pages.

USPTO Non-Final Rejection for U.S. Appl. No. 09/989,777 dated Sep. 13, 2005; 18 pages.

USPTO Non-Final Rejection for U.S. Appl. No. 09/989,777 dated Apr. 11, 2006; 21 pages.

USPTO Final Rejection for U.S. Appl. No. 09/989,777 dated Dec. 21, 2005; 29 pages.

USPTO Non-Final Rejection for U.S. Appl. No. 09/989,777 dated Jul. 5, 2005; 36 pages.

USPTO Notice of Allowance for U.S. Appl. No. 09/994,601 dated Dec. 22, 2008; 15 pages.

USPTO Final Rejection for U.S. Appl. No. 09/994,601 dated Apr. 17, 2008; 24 pages.

USPTO U.S. Appl. No. 10/033,027; "Microcontrollable Programmable System on a Chip," Warren Snyder; filed on Oct. 22, 2001; 117 pages.

USPTO U.S. Appl. No. 10/803,030; "Microcontrollable Programmable Architecture (Mixed Analog/Digital)," Snyder; filed on Mar. 16, 2004; 13 pages.

USPTO Notice of Allowance for U.S. Appl. No. 09/930,021 dated Nov. 26, 2004; 4 pages.

USPTO Final Rejection for U.S. Appl. No. 09/930,021 dated Aug. 31, 2004; 8 pages.

USPTO Non-Final Rejection for U.S. Appl. No. 09/930,021 dated Apr. 26, 2004; 6 pages.

USPTO Miscellaneous Action with SSP for U.S. Appl. No. 09/930,021 dated Oct. 1, 2001; 1 page.

USPTO Notice of Allowance for U.S. Appl. No. 09/953,423 dated Jul. 12, 2004; 6 pages.

USPTO Non-Final Rejection for U.S. Appl. No. 09/953,423 dated Feb. 6, 2004; 5 pages.

USPTO Notice of Allowance for U.S. Appl. No. 09/957,084 dated May 18, 2004; 5 pages.

USPTO Final Rejection for U.S. Appl. No. 09/957,084 dated Jan. 29, 2004; 8 pages.

USPTO Non-Final Rejection for U.S. Appl. No. 09/957,084 dated Aug. 27, 2003; 8 pages.

USPTO Final Rejection for U.S. Appl. No. 09/957,084 dated Apr. 23, 2003; 8 pages.

USPTO Non-Final Rejection for U.S. Appl. No. 09/957,084 dated Aug. 23, 2002; 6 pages.

USPTO Notice of Allowance for U.S. Appl. No. 09/969,313 dated Oct. 4, 2005; 6 pages.

USPTO Non-Final Rejection for U.S. Appl. No. 09/969,313 dated May 6, 2005; 9 pages.

USPTO Requirement for Restriction/Election for U.S. Appl. No. 09/969,313 dated Mar. 18, 2005; 6 pages.

USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.

USPTO Advisory Action for U.S. Appl. No. 09/969,311 dated Jul. 21, 2003; 2 pages.

USPTO Final Rejection for U.S. Appl. No. 09/969,311 dated Apr. 7, 2003; 7 pages.

USPTO Non-Final Rejection for U.S. Appl. No. 09/969,311 dated Nov. 6, 2002; 8 pages.

USPTO Notice of Allowance for U.S. Appl. No. 09/972,319 dated Dec. 30, 2004; 4 pages.

USPTO Non-Final Rejection for U.S. Appl. No. 09/972,319 dated Sep. 16, 2004; 9 pages.

USPTO Notice of Allowance for U.S. Appl. No. 09/972,003 dated Jul. 14, 2004; 4 pages.

USPTO Requirement for Restriction/Election for U.S. Appl. No. 09/972,003 dated May 6, 2004; 4 pages.

USPTO Non-Final Rejection for U.S. Appl. No. 09/972,003 dated Feb. 2, 2004; 10 pages.

USPTO Non-Final Rejection for U.S. Appl. No. 09/972,003 dated Aug. 19, 2003; 11 pages.

USPTO Notice of Allowance for U.S. Appl. No. 09/972,133 dated Jun. 9, 2006; 6 pages.

USPTO Final Rejection for U.S. Appl. No. 09/972,133 dated Mar. 30, 2006; 8 pages.

USPTO Non-Final Rejection for U.S. Appl. No. 09/972,133 dated Nov. 25, 2005; 9 pages.

USPTO Advisory Action for U.S. Appl. No. 09/972,133 dated Aug. 31, 2005; 3 pages.

USPTO Final Rejection for U.S. Appl. No. 09/972,133 dated Jun. 29, 2005; 10 pages.

USPTO Non-Final Rejection for U.S. Appl. No. 09/972,133 dated Mar. 8, 2005; 9 pages.

USPTO Notice of Allowance for U.S. Appl. No. 09/975,104 dated Oct. 19, 2006; 8 pages.

USPTO Non-Final Rejection for U.S. Appl. No. 09/975,104 dated Jun. 16, 2006; 8 pages.

USPTO Final Rejection for U.S. Appl. No. 09/975,104 dated Feb. 15, 2006; 7 pages.

USPTO Non-Final Rejection for U.S. Appl. No. 09/975,104 dated Aug. 16, 2005; 6 pages.

USPTO Non-Final Rejection for U.S. Appl. No. 09/975,104 dated Mar. 21, 2005; 7 pages.

USPTO Notice of Allowance for U.S. Appl. No. 09/975,030 dated Feb. 6, 2006; 7 pages.

USPTO Non-Final Rejection for U.S. Appl. No. 09/975,030 dated Oct. 20, 2005; 7 pages.

USPTO Non-Final Rejection for U.S. Appl. No. 09/975,030 dated Mar. 29, 2005; 13 pages.

USPTO Notice of Allowance for U.S. Appl. No. 09/977,111 dated Sep. 26, 2006; 6 pages.

USPTO Notice of Allowance for U.S. Appl. No. 10/272,231 dated Mar. 8, 2004; 6 pages.

USPTO Final Rejection for U.S. Appl. No. 10/272,231 dated Nov. 5, 2003; 5 pages.

USPTO Non-Final Rejection for U.S. Appl. No. 10/272,231 dated Jul. 14, 2003; 6 pages.

USPTO Notice of Allowance for U.S. Appl. No. 11/125,554 dated Feb. 7, 2008; 4 pages.

USPTO Notice of Allowance for U.S. Appl. No. 11/125,554 dated Apr. 24, 2007; 7 pages.

USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2005; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2005; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 8 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2005; 5 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Jun. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalabel Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Marouli et al., "Solving the I/O Bandwidth Problem in System on a Chip Testing," IEEE, 2000, 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT90SC Summary: "Secure Microcontrollers for Smart Cards," 1999; 7 pages.

Hwang et al., "Integrated circuit for automatically varying resistance in computer system, has pair of transistors connected in parallel with respective resistors such that resistors are bypassed when corresponding transistors are enabled," Derwent Information LTD; 2002; 2 pages.

Morrison, "IBM Eyes Merchant Packaging Services," Jul. 13, 1998; Electronic News <http://www.findarticles.com>; 4 pages.

Charles, Jr. et al., "Wirebonding: Reinventing the Process for MCMs," Apr. 1998; IEEE 7th International Conference on Multichip Modules and High Density Packaging; 3 pages.

Tran et al., "Fine Pitch and Wirebonding and Reliability of Aluminum Capped Copper Bond Pads," May 2000, IEEE Electronic Components and Technology Conference; 8 pages.

Song et al., "A 50% Power Reduction Scheme for CMOS Relaxation Oscillator," IEEE, 1999; 4 pages.

"Electronic Circuit Protector-Circuit Breaker," IBM Technical Disclosure Bulletin; vol. 36, Issue 8, Aug. 1, 1993; 1 page.

USPTO Notice of Allowance for U.S. Appl. No. 09/994,500 dated Apr. 2, 2009; 5 pages.

USPTO Notice of Allowance for U.S. Appl. No. 09/989,777 dated Mar. 9, 2009; 7 pages.

USPTO Notice of Allowance for U.S. Appl. No. 09/992,075 dated Feb. 27, 2009; 6 pages.

USPTO Non-Final Rejection for U.S. Appl. No. 09/989,771 dated Apr. 30, 2009; 11 pages.

USPTO Notice of Allowance for U.S. Appl. No. 09/989,762 dated Mar. 25, 2009; 7 pages.

USPTO Notice of Allowance for U.S. Appl. No. 09/989,762 dated Oct. 24, 2008; 7 pages.

USPTO U.S. Appl. No. 09/989,815; "A Data Driven Method and System for Monitoring Hardware Resource Usage for Programming an Electric Device" Bartz et al., filed on Nov. 19, 2001; 36 pages.

USPTO Notice of Allowance for U.S. Appl. No. 09/989,762 dated Jun. 2, 2008; 6 pages.

USPTO Notice of Allowance for U.S. Appl. No. 09/989,762 dated Jan. 2, 2008; 6 pages.

USPTO Non-Final Rejection for U.S. Appl. No. 09/989,762 dated Jul. 23, 2007; 15 pages.

USPTO Final Rejection for U.S. Appl. No. 09/989,762 dated Jan. 26, 2007; 13 pages.

USPTO Non-Final Rejection for U.S. Appl. No. 09/989,762 dated Aug. 10, 2006; 18 pages.

USPTO Final Rejection for U.S. Appl. No. 09/989,762 dated Mar. 14, 2005; 19 pages.

USPTO Non-Final Rejection for U.S. Appl. No. 09/989,762 dated Jul. 27, 2005; 15 pages.

USPTO U.S. Appl. No. 09/275,336; "Programmable Oscillator Scheme," Mar et al., filed on Mar. 24, 1999; 25 pages.

USPTO U.S. Appl. No. 09/721,316; "Programmable Oscillator Scheme," Mar et al., filed on Nov. 22, 2000; 26 pages.

USPTO U.S. Appl. No. 10/324,455; "Programmable Oscillator Scheme," Mar et al., filed on Dec. 20, 2002; 23 pages.

USPTO U.S. Appl. No. 09/998,859; "A System and a Method for Checking Lock Step Consistency between in Circuit Emulation and a Microcontroller while Debugging Process is in Progress," Craig Nemecek, filed on Nov. 15, 2001; 33 pages.

USPTO U.S. Appl. No. 09/998,834; "A System and a Method for Communication between and Ice and a Production Microcontroller while in a Halt State," Craig Nemecek et al., filed on Nov. 15, 2001; 33 pages.

USPTO U.S. Appl. No. 10/113,065; "System and Method for Automatically Matching Components in a Debugging System," Nemecek et al., filed on Mar. 29, 2002; 32 pages.

USPTO U.S. Appl. No. 09/989,574; "Method and System for using a Graphics user Interface for Programming an Electronic Device," Bartz et al., filed on Nov. 19, 2001; 43 pages.

USPTO U.S. Appl. No. 09/989,816; "Datasheet Browsing and Creation with Data-Driven Datasheet Tabs within a Microcontroller Design Tool," Bartz et al., filed on Nov. 19, 2001; 55 pages.

USPTO Notice of Allowance for U.S. Appl. No. 10/238,966 dated Jan. 27, 2009; 4 pages.

USPTO Non-Final Rejection for U.S. Appl. No. 10/238,966 dated Jun. 30, 2008; 12 pages.

USPTO Non-Final Rejection for U.S. Appl. No. 10/238,966 dated Dec. 26, 2007; 12 pages.

USPTO Final Rejection for U.S. Appl. No. 10/238,966 dated Sep. 27, 2007; 9 pages.

USPTO Non-Final Rejection for U.S. Appl. No. 10/238,966 dated Apr. 19, 2007; 7 pages.

USPTO Non-Final Rejection for U.S. Appl. No. 10/238,966 dated Oct. 20, 2006; 8 pages.

USPTO Non-Final Rejection for U.S. Appl. No. 10/238,966 dated Apr. 6, 2006; 8 pages.

USPTO Notice of Allowance for U.S. Appl. No. 10/033,027 dated Mar. 31, 2009; 7 pages.

USPTO Non-Final Rejection for U.S. Appl. No. 10/033,027 dated Dec. 18, 2008; 5 pages.

USPTO Final Rejection for U.S. Appl. No. 10/033,027 dated Jun. 8, 2007; 8 pages.

USPTO Non-Final Rejection for U.S. Appl. No. 10/033,027 dated Dec. 21, 2006; 31 pages.

USPTO Final Rejection for U.S. Appl. No. 10/033,027 dated Aug. 9, 2006; 6 pages.

USPTO Non-Final Rejection for U.S. Appl. No. 10/033,027 dated Apr. 26, 2006; 26 pages.

USPTO Final Rejection for U.S. Appl. No. 10/033,027 dated Oct. 31, 2005; 24 pages.

USPTO Non-Final Rejection for U.S. Appl. No. 10/033,027 dated Apr. 20, 2005; 20 pages.

USPTO Non-Final Rejection for U.S. Appl. No. 10/033,027 dated Oct. 18, 2004; 17 pages.

USPTO Non-Final Rejection for U.S. Appl. No. 10/001,478 dated Oct. 20, 2008; 18 pages.

USPTO Final Rejection for U.S. Appl. No. 10/001,478 dated Jun. 4, 2008; 18 pages.

USPTO Non-Final Rejection for U.S. Appl. No. 10/001,478 dated Jan. 30, 2008; 19 pages.

USPTO Final Rejection for U.S. Appl. No. 10/001,478 dated Sep. 19, 2007; 15 pages.

USPTO Non-Final Rejection for U.S. Appl. No. 10/001,478 dated Apr. 2, 2007; 17 pages.

USPTO Final Rejection for U.S. Appl. No. 10/001,478 dated Sep. 5, 2006; 19 pages.

USPTO Non-Final Rejection for U.S. Appl. No. 10/001,478 dated Mar. 15, 2006; 19 pages.

USPTO Final Rejection for U.S. Appl. No. 10/001,478 dated Oct. 24, 2005; 15 pages.

USPTO Non-Final Rejection for U.S. Appl. No. 10/001,478 dated May 16, 2005; 13 pages.

USPTO Notice of Allowance for U.S. Appl. No. 10/002,217 dated Jan. 28, 2009; 4 pages.

USPTO Notice of Allowance for U.S. Appl. No. 10/002,217 dated Oct. 14, 2008; 6 pages.

USPTO Notice of Allowance for U.S. Appl. No. 10/002,217 dated Jun. 6, 2008; 7 pages.

USPTO Final Rejection for U.S. Appl. No. 10/002,217 dated Feb. 6, 2008; 10 pages.

USPTO Non-Final Rejection for U.S. Appl. No. 10/002,217 dated Aug. 3, 2007; 10 pages.

USPTO Final Rejection for U.S. Appl. No. 10/002,217 dated Mar. 7, 2007; 12 pages.

USPTO Non-Final Rejection for U.S. Appl. No. 10/002,217 dated Oct. 2, 2006; 21 pages.

USPTO Non-Final Rejection for U.S. Appl. No. 10/002,217 dated Apr. 3, 2006; 12 pages.

USPTO Final Rejection for U.S. Appl. No. 10/002,217 dated Nov. 17, 2005; 17 pages.

USPTO Non-Final Rejection for U.S. Appl. No. 10/002,217 dated May 19, 2005; 15 pages.

USPTO Advisory Action for U.S. Appl. No. 10/001,477 dated Oct. 10, 2008; 3 pages.

"An Analog PPL-Based Clock and Data Recovery Circuit with High Input Jitter Tolerance;" Sun, Reprinted for IEEE Journal of Solid-State Circuits, 1989; 4 pages.

"WP 3.5; An Integrated Time Reference;" Blauschild, Digest of Technical Papers, 1994; 4 pages.

"Micropower CMOS Temperature Sensor with Digital Output;" Bakker et al., IEEE Journal of Solid-State Circuits, 1996; 3 pages.

U.S. Appl. No. 09/965,991: "A Novel Band-Gap Circuit for Providing an Accurate Reference Voltage Compensated for Process State, Process Variations and Temperature," Kutz et al., filed on Sep. 26, 2001; 25 pages.

U.S. Appl. No. 09/842,966; "Precision Crystal Oscillator Circuit Used in Microcontroller," Monte Mar, filed on Apr. 25, 2001; 28 pages.

USPTO Non-Final Rejection for U.S. Appl. No. 09/975,115 dated Oct. 9, 2008; 34 pages.

USPTO Final Rejection for U.S. Appl. No. 09/975,115 dated May 12, 2008; 33 pages.

USPTO Non-Final Rejection for U.S. Appl. No. 09/975,115 dated Jan. 7, 2008; 30 pages.

USPTO Non-Final Rejection for U.S. Appl. No. 09/975,115 dated Jul. 31, 2007; 28 pages.

USPTO Final Rejection for U.S. Appl. No. 09/975,115 dated Feb. 21, 2007; 25 pages.

USPTO Non-Final Rejection for U.S. Appl. No. 09/975,115 dated Oct. 31, 2008; 19 pages.

USPTO Final Rejection for U.S. Appl. No. 09/975,115 dated Jun. 23, 2008; 20 pages.

USPTO Non-Final Rejection for U.S. Appl. No. 09/975,115 dated Jan. 11, 2008; 15 pages.

USPTO Non-Final Rejection for U.S. Appl. No. 09/975,115 dated Jul. 27, 2005; 11 pages.

USPTO Non-Final Rejection for U.S. Appl. No. 09/975,115 dated Feb. 11, 2005; 86 pages.

USPTO Final Rejection for U.S. Appl. No. 09/975,338 dated Jan. 31, 2008; 21 pages.

USPTO Non-Final Rejection for U.S. Appl. No. 09/975,338 dated Aug. 14, 2007; 19 pages.

USPTO Final Rejection for U.S. Appl. No. 09/975,338 dated Feb. 27, 2007; 23 pages.

USPTO Non-Final Rejection for U.S. Appl. No. 09/975,338 dated Sep. 5, 2006; 11 pages.

USPTO Advisory Action for U.S. Appl. No. 09/975,338 dated May 15, 2006; 4 pages.

USPTO Final Rejection for U.S. Appl. No. 09/975,338 dated Jan. 18, 2006; 12 pages.

USPTO Non-Final Rejection for U.S. Appl. No. 09/975,338 dated Apr. 5, 2005; 13 pages.

USPTO Final Rejection for U.S. Appl. No. 10/008,096 dated Feb. 10, 2005; 15 pages.

USPTO Final Rejection for U.S. Appl. No. 10/008,096 dated May 16, 2008; 23 pages.

USPTO Final Rejection for U.S. Appl. No. 10/008,096 dated Sep. 4, 2007; 19 pages.

USPTO Final Rejection for U.S. Appl. No. 10/008,096 dated Oct. 13, 2006; 17 pages.

USPTO Final Rejection for U.S. Appl. No. 10/008,096 dated Nov. 25, 2005; 17 pages.

USPTO Non-Final Rejection for U.S. Appl. No. 10/008,096 dated Mar. 7, 2007; 19 pages.

USPTO Non-Final Rejection for U.S. Appl. No. 10/008,096 dated Apr. 17, 2006; 18 pages.

USPTO Non-Final Rejection for U.S. Appl. No. 10/008,096 dated Jun. 14, 2004; 24 pages.

USPTO Non-Final Rejection for U.S. Appl. No. 10/008,096 dated Jun. 24, 2005; 16 pages.

USPTO Non-Final Rejection for U.S. Appl. No. 10/008,096 dated Dec. 12, 2007; 14 pages.

USPTO Notice of Allowance for U.S. Appl. No. 10/008,096 dated Dec. 22, 2008; 24 pages.

USPTO Notice of Allowance for U.S. Appl. No. 09/975,105 dated Dec. 4, 2006; 4 pages.

USPTO Final Rejection for U.S. Appl. No. 09/975,105 dated Jul. 13, 2006; 7 pages.

USPTO Non-Final Rejection for U.S. Appl. No. 09/975,105 dated Jan. 19, 2006; 5 pages.

USPTO Non-Final Rejection for U.S. Appl. No. 09/975,105 dated Apr. 19, 2005; 9 pages.

U.S. Appl. No. 09/943,062; "Apparatus and Method for Programmable Power Management in a Programmable Analog Circuit Block," Monte Mar, filed on Aug. 29, 2001; 46 pages.

U.S. Appl. No. 10/238,966; "Method for Parameterizing a User Module," Perrin et al., filed on Sep. 9, 2002; 41 pages.

USPTO Notice of Allowance for U.S. Appl. No. 10/324,455 dated Feb. 12, 2004; 4 pages.

USPTO Non-Final Rejection for U.S. Appl. No. 10/324,455 dated Nov. 6, 2003; 4 pages.

USPTO Non-Final Rejection for U.S. Appl. No. 10/324,455 dated Aug. 21, 2003; 4 pages.

USPTO Notice of Allowance for U.S. Appl. No. 09/998,859 dated Mar. 14, 2005; 5 pages.

USPTO Non-Final Rejection for U.S. Appl. No. 09/998,859 dated Nov. 4, 2004; 6 pages.

USPTO Final Rejection for U.S. Appl. No. 09/998,859 dated Nov. 19, 2003; 5 pages.

USPTO Non-Final Rejection for U.S. Appl. No. 09/998,859 dated May 28, 2003; 5 pages.

USPTO Non-Final Rejection for U.S. Appl. No. 09/998,859 dated May 15, 2003; 6 pages.

USPTO Notice of Allowance for U.S. Appl. No. 09/998,834 dated May 19, 2005; 7 pages.

USPTO Non-Final Rejection for U.S. Appl. No. 09/998,834 dated Sep. 20, 2004; 11 pages.

USPTO Notice of Allowance for U.S. Appl. No. 10/113,065 dated Apr. 6, 2005; 8 pages.

USPTO Final Rejection for U.S. Appl. No. 10/113,065 dated Oct. 26, 2005; 17 pages.

USPTO Non-Final Rejection for U.S. Appl. No. 10/113,065 dated May 20, 2005; 14 pages.

U.S. Appl. No. 09/207,912; "Circuits(s), Architecture and Method(s) for Operating and/or Tuning a Ring Oscillator," Monte Mar, filed on Dec. 9, 1998; 23 pages.

USPTO Notice of Allowance for U.S. Appl. No. 10/001,477 dated May 6, 2009; 6 pages.

Goodenough, F. "Analog Counterparts of FPGAS Ease System Design" Eletronic Design, Penton Publishing, Cleveland, OH, US vol. 42, No. 21, Oct. 14, 1994; 10 pages.

Harbaum, T. et al. "Design of a Flexible Coprocessor Unit" Proceedings of the Euromicro Conference, XX XX, Sep. 1999; 10 pages.

USPTO U.S. Appl. No. 09/924,734; "Programmable Microcontroller (PSoC) Architecture (Mixed Analog/Digital)"; Snyder et al., filed on Aug. 7, 2001; 28 pages.

USPTO U.S. Appl. No. 09/909,045; "Digital Configurable Macro Architecture," Warren Snyder, filed on Jul. 18, 2001; 37 pages.

USPTO U.S. Appl. No. 09/909,109; "Configuring Digital Functions in a Digital Configurable Macro Architecture," Warren Snyder, filed on Jul. 18, 2001; 38 pages.

USPTO U.S. Appl. No. 09/909,047; "A Programmable Analog System Architecture," Monte Mar, filed on Jul. 18, 2001; 60 pages.

USPTO U.S. Appl. No. 09/930,021; "Programmable Methodology and Architecture for a Programmable Analog System," Mar et al., filed on Aug. 14, 2001; 67 pages.

USPTO U.S. Appl. No. 09/969,311; "Method for Synchronizing and Resetting Clock Signals Supplied to Multiple Programmable Analog Blocks," Bert Sullam, filed on Oct. 1, 2001; 57 pages.

USPTO U.S. Appl. No. 09/875,599; "Method and Apparatus for Programming a Flash Memory," Warren Snyder, filed on Jun. 5, 2001; 23 pages.

USPTO U.S. Appl. No. 09/975,115; "In-System Chip Emulator Architecture," Snyder et al., filed on Oct. 10, 2001; 38 pages.

USPTO U.S. Appl. No. 09/953,423; "A Configurable Input/Output Interface for a Microcontroller," Warren Snyder, filed on Sep. 14, 2001; 28 pages.

USPTO U.S. Appl. No. 09/893,050; "Multiple Use of Microcontroller Pad," Kutz et al., filed on Jun. 26, 2001; 21 pages.

USPTO U.S. Appl. No. 09/929,891; "Programmable Architecture for a Programmable Analog System," Mar et al., filed on Aug. 14, 2001; 82 pages.

USPTO U.S. Appl. No. 09/969,313; "Architecture for Synchronizing and Resetting Clock Signals Supplied to Multiple Analog Programmable Analog Blocks," Bert Sullam, filed on Oct. 1, 2001; 50 pages.

USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al., "Microcontrollers", 1992 McGraw-Hill; 11 pages.
Ganapathy et al., "Hardware Emulation for Functional Verification of K5", Jun. 1996, 33rd Design Automation Conference Proceedings, Jun. 3-7, 1996, 4 pages.
The U.S. Appl. No. 60/243,708 "Advanced Programmable Microcontroller Device"; Snyder et al., filed on Oct. 26, 2000; 277 pages.
"Webster's Third New International Dictionary", 1996, G. & C. Merriam Company; 3 pages (including pages 1328-1329).
USPTO Advisory Action for U.S. Appl. No. 09/998,848 dated Sep. 7, 2005; 3 pages.
USPTO U.S. Appl. No. 09/957,084; "Crystal-Less Oscillator with Trimmable Analog Current Control for Increased Stability," Mar et al., filed on Sep. 19, 2001; 28 pages.
USPTO U.S. Appl. No. 10/011,214; "Method and Circuit for Synchronizing a Write Operation between an On-Chip Microprocessor and an On-Chip Programmable Analog Device Operating at Different Frequencies," Sullam et al., filed on Oct. 25, 2001; 49 pages.
USPTO U.S. Appl. No. 09/972,319; "Method for Applying Instructions to Microprocessor in Test Mode," Warren Synder, filed on Oct. 5, 2001; 31 pages.
USPTO U.S. Appl. No. 09/972,003; "Test Architecture for Microcontroller Providing for a Serial Communication Interface," Warren Snyder, filed on Oct. 5, 2001; 32 pages.
USPTO U.S. Appl. No. 09/972,133; "Method for Entering Circuit Test Mode," Warren Snyder, filed on Oct. 5, 2001; 30 pages.
USPTO U.S. Appl. No. 09/973,535; "Architecture for Decimalion Algorithm," Warren Snyder, filed on Oct. 9, 2001; 26 pages.
USPTO U.S. Appl. No. 09/977,111; "A Frequency Doubler Circuit with Trimmable Current Control," Shutt et al., filed on Oct. 11, 2001; 35 pages.
USPTO U.S. Appl. No. 10/272,231; "Digital Configurable Macro Architecture," Warren Snyder, filed on Oct. 15, 2002; 36 pages.
USPTO U.S. Appl. No. 11/125,554; "A Method for a Efficient Supply to a Microcontroller," Kutz et al., filed on May 9, 2005; 1 page.
USPTO U.S. Appl. No. 09/855,868; "Protecting Access to Microcontroller Memory Blocks," Warren Snyder, filed on May 14, 2001; 28 pages.
USPTO U.S. Appl. No. 09/887,923; "Novel Method and System for Interacting between a Processor ans a Power on Reset to Dynamically Control Power States in a Microcontroller," Kutz et al., filed on Jun. 22, 2001; 44 pages.
USPTO U.S. Appl. No. 10/000,383; "System and Method of Providing a Programmable Clock Architecture for an Advanced Microcontroller," Sullam et al., filed on Oct. 24, 2001; 34 pages.
USPTO U.S. Appl. No. 10/001,477; "Breakpoint Control in an In-Circuit Emulation System," Roe et al., filed on Nov. 1, 2001; 43 pages.
USPTO U.S. Appl. No.10/004,197; "In-Circuit Emulator with Gatekeeper Based Halt Control," Nemecek et al., filed on Nov. 14, 2001; 47 pages.
USPTO U.S. Appl. No. 10/004,039; "In-Circuit Emulator with Gatekeeper for Watchdog Timer" Necemek et al., filed on Nov. 14, 2001; 46 pages.
USPTO U.S. Appl. No. 10/002,217; "Conditional Branching in an In-Circuit Emulation System," Craig Nemecek, filed on Nov. 1, 2001; 43 pages.
USPTO U.S. Appl. No. 10/001,568; "Combined In-Circuit Emulator and Programmer," Nemecek et al., filed on Nov. 1, 2001; 47 pages.
USPTO U.S. Appl. No. 10/001,478; "In-Circuit Emulator and POD Synchronized Boot," Nemecek et al., filed on Nov. 1, 2001; 44 pages.
USPTO U.S. Appl. No. 09/887,955; "Novel Power on Reset Circuit for Microcontroller," Kutz et al., filed on Jun. 22, 2001; 42 pages.
USPTO U.S. Appl. No. 09/826,397; "Method and Circuit for Allowing a Microprocessor to Change its Operating Frequency on-the-Fly," Bert Sullam, filed on Apr. 2, 2001; 24 pages.
USPTO U.S. Appl. No. 09/893,048; "A Microcontroller having on On-Chip High Gain Amplifier," Kutz et al., filed on Jun. 26, 2001; 22 pages.
USPTO U.S. Appl. No. 09/912,768; "A Microcontroller having on Dual Mode Relax Oscillator that is Trimmable," James Shutt et al., filed on Jul. 24, 2001; 33 pages.
USPTO U.S. Appl. No. 09/922,419; "A Power Supply Pump Circuit for a Microcontroller," Kutz et al., filed on Aug. 3, 2001; 38 pages.
USPTO U.S. Appl. No. 09/922,579; "A Method for a Efficient Supply to a Microcontroller," Kutz et al., filed on Aug. 3, 2001; 37 pages.
USPTO U.S. Appl. No. 09/923,461; "Non-Interfering Multiply-Mac (Multiply Accumulate) Circuit," Warren Snyder et al., filed on Aug. 6, 2001; 25 pages.
USPTO U.S. Appl. No. 09/935,454; "Method and Apparatus for Local and Global Power Management in a Programmable Analog Circuit," Monte Mar et al., filed on Aug. 22, 2001; 51 pages.
Bursky, "FPGA Combines Multiple Interfaces and Logic," Electronic Devices, vol. 48 No. 20, pp. 74-76 (Oct. 2, 2000); 5 pages.
Anonymous, "Warp Nine Engineering—The IEEE 1264 Experts-F/Port Product Sheet," undated web page found at http://www.fapco.com/fport.htm; printed on Apr. 12, 2005; 2 pages.
Anonymous, "F/Port:Fast Parallel Port for the PC Installation Manual" Release 7.1, circa 1997, available for download from http://www.fapo.com/fport.htm; 25 pages.
Nam et al., "Fast Development of Source-Level Debugging System Using Hardware Emulation"; IEEE 2000; 4 pages.
Huang et al., "Iceberg: An Embedded In-Circuit Emulator Synthesizer For Microcontrollers"; ACM 1999; 6 pages.
Khan et al.; "FPGA Architectures for Asic Hardware Emulators"; IEEE 1993, 5 pages.
Oh et al.; Emulator Environment Based on an FPGA Prototyping Board; IEEE Jun. 21-23, 2000; 6 pages.
Hong et al., "An FPGA-Based Hardware Emulator for Fast Fault Emulation"; IEEE 1997; 4 pages.
Ching et al., "An In-Circuit-Emulator for TMS320C25"; IEEE 1994; 6 pages.
Pastemak et al.; "In-Circuit-Emulation in ASIC Architecture Core Designs", IEEE 1989; 4 pages.
Melear; "Using Background Modes for Testing, Debugging and Emulation of Microcontrollers"; IEEE 1997; 8 pages.
Walters, Stephen; "Computer-Aided Prototyping for ASIC-Based Systems", 1991, IEEE Design & Test of Computers: vol. 8, Issue 2; 8 pages.
Anonymous; "JEENI JTAG EmbeddedICE Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0, 33 pages.
Stallman et al.; "Debugging with GDB the GNU Source-Level Debugger", Jan. 1994; retrieved on May 2, 2005 from http://www.cs.utah.edu; 4 pages.
Wikipedia.org; "Von Neumann architecture"; retrieved from http://en.wikipedia.org/wiki/Von_Neumann_architecture on Jan. 22, 2007; 4 pages.
Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.
"POD—Piece of Data, Plain Old Documentation, Plain Old Dos . . . "; retrieved on Nov. 14, 2005 from http://www.auditmypc.com/acronym/POD.asp; 2 pages.
USPTO Non-Final Rejection for U.S. Appl. No. 09/989,767 dated Oct. 6, 2004; 15 pages.
USPTO Final Rejection for U.S. Appl. No. 09/989,771 dated Feb. 27, 2007; 8 pages.

USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Non-Final Rejection for U.S. Appl. No. 09/989,765 dated Sep. 19, 2007; 14 pages.
USPTO Non-Final Rejection for U.S. Appl. No. 09/989,765 dated sep. 26, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Final Rejection for U.S. Appl. No. 09/989,755 dated Mar. 31, 2009; 18 pages.
USPTO Final Rejection for U.S. Appl. No. 09/989,778 dated Mar. 16, 2009; 26 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Circuit Emulators—descriptions of the major ICEs around"; retrieved on Nov. 14, 2005 from http://www.algonet.se/~staffann/developer/emulator.htm; 6 pages.
USPTO U.S. Appl. No. 09/975,104; "Capturing Test/Emulation and Enabling Real-Time Debugging Using FPGA for In-Circuit Emulation," Warren Snyder, filed on Oct. 10, 2001; 35 pages.
USPTO Non-Final Rejection for U.S. Appl. No. 09/989,767 dated Jul. 24, 2008; 21 pages.
Anonymous; "Using Debug"; 1999; Prentice-Hall Publishing; 20 pages.
Harrison et al., "Xilinx FPGA Design in a Group Environment Using VHDS and Synthesis Tools", Colloquium on Digital System Design Using Synthesis Techniques; Feb. 15, 1996; 4 pages.

Microsoft Press Computer User's Dictionary; 1998; 3 pages (including p. 18).
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
USPTO U.S. Appl. No. 09/975,338; "Method for Breaking Execution of a Test Code in DUT and Emulator Chip Essentially Simultaneously and Handling Comples Breakpoint Events," Nemecek et al., filed on Oct. 10, 2001; 34 pages.
USPTO U.S. Appl. No. 09/975,030; "Emulator Chip-Board Architecture for Interface," Snyder et al., filed on Oct. 10, 2001; 37 pages.
Wikipedia—Main Page, retrieved on Mar. 8, 2006 from http://en.wikipedia.org/wiki/Main_Page and http://en.wikipedia.org/wiki/Wikipedia;Introduction; 5 pages.
Wikipedia—Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dahl, et al.; "Emulation of the Sparcle Microprocessor with the MIT Virtual Wires Emulation System"; 1994; IEEE; 9 pages.
Bauer et al.; "A Reconfigurable Logic Machine for Fast Event-Driven Simulation"; Jun. 1998; Design Automation Conference Proceedings; 8 pages.
USPTO U.S. Appl. No. 09/975,105; "Host to FPGA Interface in an In-Circuit Emulation System," Craig Nemecek, filed on Oct. 10, 2001; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/989,767 dated Jul. 2, 2007; 22 pages.
USPTO Notice of Allowance for U.S. Appl. No. 09/992,076 dated Mar. 25, 2008; 23 pages.
USPTO Notice of Allowance for U.S. Appl. No. 09/992,076 dated Jul. 29, 2008; 6 pages.
USPTO Advisory Action for U.S. Appl. No. 09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
"New Object Domain R3 Beta Now Available (Build 134)1" Mar. 13, 2001; <http://web.archive.org/web/200100331202605/www.objectdomain.com/domain30/index.html>; 2 pages.
"OMG XML Metadata Interchange (XMI) Specifications" 2000; 17 pages.
Electronic Tools Company: E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press, 5th Edition; 3 pages.
Wikipedia "XML" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/samples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers A New Level Of System Flexibility"; Electronic Design; Nov. 6, 2000; 11 pages.
Cypress MicroSystem, Inc. "Cypress Customer Forums" retrieved from <http://www.cypress.com/forums/messageview>; Nov. 30, 2004; 1 page.
Cypress MicroSystem, Inc. "PsoC Designer; Integrated Development Environment User Guide"; Rev. 1-18; Sep. 8, 2003; 193 pages.

Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insiders Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated May 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer; Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet Communications and Consumer Systems;" 2000, <http://www.cypressmicro.com/corporate/CY_Announces_nov_13_2000.html>; 3 pages.
Huang et al., ICEBERG, An Embedded In-Circuit Emulator Synthesizer for Microcontrollers, Proceedings of the 36th Design Automation Conference Jun. 21-26, 1999; 6 pages.
Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062 dated Jun. 22, 2007; 12 pages.
USPTO Miscellaneous Action for U.S. Appl. No. 09/943,062 dated Jan. 30, 2006; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2005; 19 pages.
USPTO Final Rejection for U.S. Appl. No. 10/113,064 dated Oct. 18, 2005; 22 pages.
USPTO Non-Final Rejection for U.S. Appl. No. 10/113,064 dated Apr. 25, 2005; 15 pages.
USPTO U.S. Appl. No. 10/113,064; "Method and System for Debugging through Supervisory Operating Codes and Self Modifying Codes," Roe et al., filed on Mar. 29, 2002; 36 pages.
USPTO U.S. Appl. No. 10/002,726; "Method and Apparatus for Generating Microcontroller Configuration Information," Ogami et al., filed on Oct. 24, 2001; 54 pages.
USPTO Notice of Allowance for U.S. Appl. No. 10/002,726 dated Feb. 6, 2007; 7 pages.
USPTO Non-Final Rejection for U.S. Appl. No. 10/002,726 dated Sug. 28, 2006; 10 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Dec. 13, 2004; 7 pages.
USPTO U.S. Appl. No. 10/818,005; "Techniques for Generating Microcontroller Configuration Information," Ogami et al., filed on Jun. 12, 2007; 61 pages.
USPTO U.S. Appl. No. 11/850,260; "Circuit and Method for Improving the Accuracy of a Crystal-less Oscillator Having Dual-Frequency Modes," Wright et al., filed on Sep. 5, 2007; 33 pages.
USPTO Non-Final Rejection for U.S. Appl. No. 11/850,260 dated Mar. 6, 2009; 7 pages.

USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2006; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 6 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
USPTO U.S. Appl. No. 11/644,100; "Differential-to-single ended signal converter circuit and medtod," Jonathon Stiff, filed on Dec. 21, 2006; 33 pages.
USPTO U.S. Appl. No. 12/218,404; "Voltage Controlled Oscillator Delay Cell and Method," Sivadasan et al., filed on May 1, 2006; 24 pages.
USPTO U.S. Appl. No. 12/218,404; "Voltage Controlled Oscillator Delay Cell and Method," Sivadasan et al., filed on Jul. 14, 2008; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
USPTO U.S. Appl. No. 12/218,404; "Open Loop Bandwidth Test Architecture and Method for Phase Locked Loop (PLL)," Jonathon Stiff, filed on May 19, 2005; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
USPTO U.S. Appl. No. 11/322,044; "Split charge pump PLL architecture," Jonathon Stiff, filed on Dec. 28, 2005; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
USPTO U.S. Appl. No. 10/305,589; "Current Controlled Delay Circuit," Jonathon Stiff, filed on Feb. 26, 2002; 18 pages.
USPTO U.S. Appl. No. 09/849,154; "Reduced Static Phase Error CMOS PLL Charge Pump," Jonathon Stiff, filed on May 4, 2001; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson, "A 2-1600-MHz CMOS Clock Recovery PLL with Low-Vdd Capability," IEEE Journal of Solid-State Circuits, vol. 34, No. 12, Dec. 1999, 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 pages.

USPTO U.S. Appl. No. 10/327,217; "Single Ended Clock Signal Generator Having a Differential Output," Richmond et al., filed on Dec. 20, 2002; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
USPTO U.S. Appl. No. 10/871,582; "LVDS Input Circuit with Extended Common Mode Range," Reinschmidt et al., filed on Jun. 17, 2004; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
USPTO U.S. Appl. No. 09/404,891; "Method, Architecture and Circuitry for Controlling Pulse Width in a Phase and/or Frequency Detector," Scott et al., filed on Sep. 24, 1999; 17 pages.
USPTO Notice of Allowance for U.S. Appl. No. 10/226,911 dated Jun. 20, 2004; 4 pages.
USPTO Non-Final Rejection for U.S. Appl. No. 10/226,911 dated Mar. 19, 2004; 6 pages.
USPTO U.S. Appl. No. 10/226,911; "Calibration of Integrated Circuit Time Constants," Gehring et al., filed on Aug. 22, 2002; 32 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
USPTO U.S. Appl. No. 09/943,149; "Method for Phase Locking in a Phase Lock Loop," Moyal et al., filed on Aug. 30, 2001; 21 pages.
Durham et al., "Intergrated Continuous-Time Balanced Filters for 16-Bit OSP Interfaces," IEEE, 1993, 6 pages.
Durham et al., "Circuit Architecture for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
USPTO U.S. Appl. No. 09/047,595; "Roving Range Control to Limited Receive PLL Frequency of Operation," Paul H. Scott, filed on Mar. 29, 1998; 35 pages.
USPTO U.S. Appl. No. 09/216,460; "Circuit and Method for Controlling an Output of a Ring Oscillator," Abugharbish et al., filed on Dec. 18, 1996; 21 pages.
USPTO U.S. Appl. No. 09/471,914; "Reference-Free Clock Generator and Data Recovery PLL," Dalmia et al., filed on Dec. 23, 1999; 32 pages.
USPTO U.S. Appl. No. 09/471,576; "Reference-Free Clock Generation and Data Recovery PLL," Kamal Dalmia, filed on Dec. 23, 1999; 30 pages.
USPTO U.S. Appl. No. 10/083,442; "Method/Architecture for a Low Gain PLL with Wide Frequency Range," Meyers et al., filed on Feb. 26, 2002, 28 pages.
USPTO U.S. Appl. No. 09/470,665; "Digital Phase/Frequency Detector, and Clock Generator and Data Recovery PLL Containing the Same," Kamal Dalmia, filed on Dec. 23, 1999; 26 pages.
USPTO U.S. Appl. No. 09/893,161; "Architecture of a PLL with Dynamic Frequency Control on a PLD," Michael T. Moore, filed on Jun. 27, 2001; 32 pages.

USPTO U.S. Appl. No. 09/608,753; "PLL Lockout Watchdog," Wilson et al., filed on Aug. 24, 2004; 24 pages.
USPTO U.S. Appl. No. 09/398,956; "Frequency Acquisition Rate Control in Phase Lock Loop Circuits," Moyal et al., filed on Sep. 17, 1999; 35 pages.
USPTO U.S. Appl. No. 09/747,262; "Linearized Digital Phase-Locked Loop," Williams et al., filed on Dec. 22, 2000; 9 pages.
USPTO U.S. Appl. No. 09/981,448; "Oscillator Turning Method," Lane T. Hauck, filed on Oct. 17, 2001; 28 pages.
USPTO U.S. Appl. No. 09/538,989; "Memory Based Phase Locked Loop," Rengarajan S. Krishnan, filed on Mar. 30, 2000; 27 pages.
USPTO U.S. Appl. No. 09/048,905; "Programmable Clock Generator," Mann et al., filed on Mar. 25, 1998; 42 pages.
USPTO U.S. Appl. No. 08/865,342; "Programmable Clock Generator," Mann et al., filed on May 29, 1997; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
USPTO U.S. Appl. No. 10/293,392; "Low Voltage Receiver Circuit and Method for Shifting the Differential Input Signals of the Receiver Depending on a Common Mode Voltage of the Input Signals," Maher et al., filed on Nov. 13, 2002; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
USPTO U.S. Appl. No. 10/288,003; "Low Voltage Differential Signal Driver Circuit and Method," Roper et al., filed on Nov. 4, 2002; 30 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
USPTO U.S. Appl. No. 11/200,619; "Providing hardware independence to automate code generation of processing device firmware," Snyder et al., filed on Aug. 10, 2005; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
USPTO U.S. Appl. No. 11/201,922; "Design model for a hardware device-independent method of defining embedded firmware for programmable systems," McDonald et al., filed on Aug. 10, 2005; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
USPTO U.S. Appl. No. 11/201,627; "Method and an apparatus to design a processing system using a graphical user interface," Ogami et al., filed on Aug. 10, 2005; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
USPTO U.S. Appl. No. 09/989,808; "Automatic generation of application program interfaces, source code, interrupts, and data sheets for microcontroller programmable," Bartz et al., filed on Nov. 19, 2001; 67 pages.

USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
USPTO U.S. Appl. No. 10/109,979; "Graphical user interface with logic unifying functions," Anderson et al., filed on Mar. 29, 2002; 100 pages.
USPTO U.S. Appl. No. 09/989,781; "System and method for decoupling and iterating resources associated with a module," Ogami et al., filed on Nov. 19, 2001; 40 pages.
USPTO U.S. Appl. No. 10/109,979; "User defined names for registers in memory banks derived from configurations," Ogami et al., filed on Nov. 19, 2001; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
USPTO U.S. Appl. No. 09/989,819; "System and method for creating a boot file utilizing a boot template," Ogami et al., filed on Nov. 19, 2001; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
USPTO U.S. Appl. No. 09/989,761; "Storing of global parameter defaults and using them over two or more design projects," Ogami et al., filed on Nov. 19, 2001; 37 pages.
Wang et al., "Synthesizing Operating System Based Devices Drivers in Embedded Systems," Oct. 1-3, 2003; ACM; 8 pages.
Lutovac et al. "Symbolic Compulation of Digital Filler Transfer Function Using MATLAB," Proceedings of 23rd International Conference on Microelectronics (MIEL 2002), vol. 2, NIS, Yugoslavia; 4 pages.
Nouta et al., "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Searching Report and Written Opinion of the International Searching Authority for PCT/US05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Search Report for PCT/US05/28791, filed Aug. 12, 2005, mailed Mar. 31, 2008; 8 pages.
Kory Hopkins, "Definition", Jan. 18, 1997; <http://www.cs.sfu.ca/cs/people/GradStudent.html>; 1 page.

Ebeling et al., "Validating VLSI Circuit Layout by Wirelist Comparison;" Sep. 1963; in proceedings of the IEEE International Conference on Computer Aided Design (ICCAD-83); 2 pages.
"The Gemini Netlist Comparison Project," http://www.cs.washington.edu/research/projects/lis/www/gemini/gemini.html> larry@cs.washington.edu; Mar. 19, 2002; 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebeling, "Gemini II: A Second Generation Layout Validation Program," 1968; in proceedings of the IEEE International Conference on Computer Aided Design (ICCAD-88); 4 pages.
USPTO U.S. Appl. No. 12/132,527; "System and Method for Performing Next Placements and Pruning of Disallowed Placements for Programming an Integrated Circuit," Ogami et al., filed on Jun. 3, 2008; 44 pages.
USPTO U.S. Appl. No. 12/366,468; "System and Method for Dynamically Generating a Configuration Datasheet," Anderson et al.; filed on Jan. 20, 2009; 27 pages.
Written Opinion of the International Search Authority for International Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO U.S. Appl. No. 09/475,879; "Programmable Logic Device," Lacey et al.; filed on Dec. 30, 1999; 50 pages.
USPTO U.S. Appl. No. 09/475,808; "Configurable Memory for Programmable Logic Circuits," Lacey et al., filed on Dec. 30, 1999; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
USPTO U.S. Appl. No. 10/137,497; "Reconfigurable Testing System and Method," Pleis et al., filed on May 1, 2002; 40 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.

USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Non-Final Rejection for U.S. Appl. No. 10/133,581 dated Feb. 24, 2006; 11 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Notice of Allowance for U.S. Appl. No. 11/347,189 dated Sep. 27, 2007; 4 pages.
USPTO Non-Final Rejection for U.S. Appl. No. 11/347,189 dated Jun. 8, 2007; 6 pages.
USPTO Notice of Allowance for U.S. Appl. No. 12/070,547 dated Feb. 24, 2010; 4 pages.
USPTO Final Rejection for U.S. Appl. No. 12/070,547 dated Oct. 30, 2009; 5 pages.
USPTO Non-Final Rejection for U.S. Appl. No. 12/070,547 dated Jun. 3, 2009; 6 pages.
USPTO Non-Final Rejection for U.S. Appl. No. 11/201,922 dated Jun. 11, 2010; 12 pages.
USPTO Notice of Allowance for U.S. Appl. No. 09/943,062 dated Jun. 29, 2010; 4 pages.
USPTO Final Rejection for U.S. Appl. No. 11/818,005 dated May 24, 2010; 8 pages.
USPTO Non-Final Rejection for U.S. Appl. No. 12/132,527 dated Apr. 29, 2010; 7 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Mooris Mano, "Computer System Architecture," 1982 Prentice-Hall, 2nd Edition, pp. 261-264 and 435-440; 14 pages.
Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://www.circuitcellar.com/library/print/0804/eady169/2.htm>; 4 pages.

U.S. Appl. No. 12/058,586: "System and Mehod for Montoring a Target Device" Ogami et al., filed on Mar. 28, 2008; 41 pages.

U.S. Appl. No. 12/058,534: "System and Method for Controlling a Target Device," Ogami et al., filed on Mar. 28, 2008; 40 pages.

U.S. Appl. No. 12/004,833: "Systems and Methods for Dynamically Reconfiguring a Programmable System on a Chip," Ogami et al., filed on Dec. 21, 2007; 40 pages.

U.S. Appl. No. 12/058,569: "Configuration of Programmable IC Design Elements," Best et al., filed on Mar. 28, 2008; 19 pages.

U.S. Appl. No. 12/057,149: "Power Management Architecture, Method and Configuration System," Kenneth Ogami, filed on Mar. 27, 2008; 34 pages.

U.S. Appl. No. 12/765,400: "Autonomous Control in a Programmable System," Sullam et al., filed on Apr. 22, 2010; 30 pages.

International Search Report for International Application No. PCT/US10/33626 mailed Jun. 24, 2010; 3 pages.

The Written Opinion of the International Search Report for International Application No. PCT/US10/33626 mailed Jun. 24, 2010; 5 pages.

USPTO Non-Final Rejection for U.S. Appl. No. 12/060,176 dated Mar. 30, 2010; 22 pages.

John Mangino, "Using DMA with High Performance Peripherals to Maximize System Performance," 2007, Texas Instruments, pp. 1-23; 23 pages.

Balough et al., "White Paper: Comparing IP Integration Approaches for FPGA Implementation," Feb. 2007, Version 1.1, Altera, pp. 1-7; 7 pages.

A.F.Harvey, "DMA Fundamentals on Various PC Platforms," 2001, 2004, National Instruments Corporation, pp. 1-19; 19 pages.

Vixel, "InSpeed SOC 320 Embedded Storage Switch," 2003, Vixel, pp. 1-5; 5 pages.

USPTO Non-Final Rejection for U.S. Appl. No. 12/058,569 dated Aug. 2, 2010; 9 pages.

USPTO Miscellaneous Action for U.S. Appl. No. 10/113,581 dated Jun. 23, 2010; 6 pages.

USPTO Miscellaneous Action for U.S. Appl. No. 10/001,478 dated Feb. 23, 2010; 5 pages.

USPTO Notice of Allowance for U.S. Appl. No. 10/001,478 dated Jun. 2, 2010; 11 pages.

USPTO Notice of Allowance for U.S. Appl. No. 11/985,340 dated Jun. 9, 2010; 8 pages.

USPTO Notice of Allowance for U.S. Appl. No. 11/850,260 dated Jul. 2, 2010; 8 pages.

USPTO Notice of Allowance for U.S. Appl. No. 12/060,128 dated Oct. 19, 2009; 8 pages.

USPTO Non-Final Rejection for U.S. Appl. No. 09/975,338 dated Apr. 30, 2010; 2 pages.

USPTO Advisory Action for U.S. Appl. No. 11/818,005 dated Jul. 30, 2010; 3 pages.

USPTO Advisory Action for U.S. Appl. No. 11/201,627 dated Aug. 5, 2010; 3 pages.

USPTO Final Rejection for U.S. Appl. No. 11/201,627 dated May 24, 2010; 26 pages.

USPTO Non-Final Rejection for U.S. Appl. No. 11/166,622 dated Jun. 22, 2010; 11 pages.

USPTO Final Rejection for U.S. Appl. No. 11/166,622 dated Mar. 18, 2010; 12 pages.

USPTO Non-Final Rejection for U.S. Appl. No. 11/698,660 dated May 21, 2010; 15 pages.

USPTO Advisory Action for U.S. Appl. No. 11/644,100 dated Jul. 21, 2010; 3 pages.

USPTO Final Rejection for U.S. Appl. No. 11/644,100 dated May 19, 2010; 13 pages.

USPTO Final Rejection for U.S. Appl. No. 11/865,672 dated Dec. 30, 2009; 6 pages.

USPTO Final Rejection for U.S. Appl. No. 11/857,947 dated Oct. 14, 2009; 22 pages.

USPTO Non-Final Rejection for U.S. Appl. No. 11/857,947 dated Feb. 3, 2010; 23 pages.

USPTO Non-Final Rejection for U.S. Appl. No. 11/857,947 dated Jul. 21, 2010; 15 pages.

USPTO Non-Final Rejection for U.S. Appl. No. 11/968,145 dated Mar. 4, 2010; 11 pages.

USPTO Final Rejection for U.S. Appl. No. 11/968,145 dated Aug. 2, 2010; 6 pages.

USPTO Non-Final Rejection for U.S. Appl. No. 12/104,678 dated Jul. 2, 2010; 8 pages.

USPTO Advisory Action for U.S. Appl. No. 11/779,439 dated Mar. 30, 2009; 3 pages.

USPTO Notice of Allowance for U.S. Appl. No. 10/001,478 dated Sep. 7, 2010; 10 pages.

USPTO Notice of Allowance for U.S. Appl. No. 11/818,005 dated Oct. 26, 2010; 10 pages.

USPTO Final Rejection for U.S. Appl. No. 12/132,527 dated Oct. 14, 2010; 8 pages.

USPTO Non-Final Rejection for U.S. Appl. No. 11/201,627 dated Sep. 30, 2010; 6 pages.

USPTO Final Rejection for U.S. Appl. No. 11/698,660 dated Sep. 3, 2010; 19 pages.

USPTO Advisory Action for U.S. Appl. No. 11/698,660 dated Nov. 10, 2010; 3 pages.

USPTO Non-Final Rejection for U.S. Appl. No. 11/644,100 dated Sep. 15, 2010; 10 pages.

USPTO Final Rejection for U.S. Appl. No. 12/060,176 dated Oct. 12, 2010; 22 pages.

USPTO Advisory Action for U.S. Appl. No. 12/136,577 dated Oct. 29, 2010; 3 pages.

USPTO Final Rejection for U.S. Appl. No. 12/132,527 dated Oct. 14, 2010 8 pages.

USPTO Non-Final Rejection for U.S. Appl. No. 12/004,833 dated Dec. 21, 2010 8 pages.

USPTO Notice of Allowance for U.S. Appl. No. 12/058,569 dated Dec. 13, 2010; 6 pages.

USPTO Non-Final Rejection for U.S. Appl. No. 11/698,660 dated Dec. 13, 2010; 20 pages.

USPTO Notice of Allowance for U.S. Appl. No. 11/644,100 dated Jan. 6, 2011; 6 pages.

USPTO Non-Final Rejection for U.S. Appl. No. 11/201,922 dated Dec. 28, 2010; 14 pages.

USPTO Final Rejection for U.S. Appl. No. 11/166,622 dated Dec. 7, 2010; 12 pages.

USPTO Final Rejection for U.S. Appl. No. 09/989,771 dated Jan. 4, 2011; 12 pages.

USPTO Non-Final Rejection for U.S. Appl. No. 09/975,338 dated Apr. 30, 2010; 10 pages.

USPTO Non-Final Rejection for U.S. Appl. No. 11/818,005 U.S. Appl. No. dated Oct. 26, 2010; 10 pages.

USPTO Final Rejection for U.S. Appl. No. 12/132527 dated Oct. 14, 2010; 8 pages.

USPTO Notice of Allowance for U.S. Appl. No. 12/057,149 dated Nov. 30, 2010; 7 pages.

USPTO Final Rejection for U.S. Appl. No. 11/857,947 dated Jan. 4, 2011; 14 pages.

USPTO Non-Final Rejection for U.S. Appl. No. 11/968,145 dated Jan 5, 2011; 8 pages.

USPTO Final Rejection for U.S. Appl. No. 12/104,678 dated Dec. 3, 2010; 9 pages.

USPTO Advisory Action for U.S. Appl. No. 09/994,601 dated Mar. 23, 2010; 2 pages.

USPTO Non-Final Rejection for U.S. Appl. No. 11/818,005 dated Oct. 26, 2010; 10 pages.

USPTO Final Rejection for U.S. Appl. No. 12/132,527 dated 1Oct. 14, 202010; 8 pages.

USPTO Notice of Allowance for U.S. Appl. No. 09/998,848 dated Oct. 13, 2010; 4 pages.

USPTO Non-Final Rejection for U.S. Appl. No. 09/998,848 dated Jun. 21, 2010; 15 pages.

USPTO Advisory Action for U.S. Appl. No. 09/998,848 dated Feb. 24, 2010; 3 pages.

USPTO Non-Final Rejection for U.S. Appl. No. 09/989,767 dated Jul. 9, 2010; 22 pages.

USPTO Non-Final Rejection for U.S. Appl. No. 09/989,771 dated Jul. 20, 2010; 12 pages.

USPTO Advisory Action for U.S. Appl. No. 09/989,771 dated Feb. 3, 2010; 3 pages.

USPTO Notice of Allowance for U.S. Appl. No. 10/113,581 dated Sep. 3, 2010; 11 pages.
USPTO Final Rejection for U.S. Appl. No. 12/060,176 dated Oct. 12, 2010; 22 pages.
USPTO Non-Final Rejection for U.S. Appl. No. 12/058,534 dated Jan. 11, 2011; 17 pages.
USPTO Requirement Restriction for U.S. Appl. No. 12/004,833 dated Sep. 22, 2010; 6 pages.
U.S. Appl. No. 12/058,586; "System and Method for Monitoring a Target Device," Kenneth Ogami et al. filed on Mar. 28, 2008; 56 pages.
USPTO Notice of Allowance for U.S. Appl. No. 10/118,682 dated Apr. 3, 2006; 4 pages.
USPTO Final Rejection for U.S. Appl. No. 10/118,682 dated Oct. 12, 2005; 11 pages.
USPTO Non-Final Rejection for U.S. Appl. No. 10/118,682 dated Jun. 16, 2005; 12 pages.
USPTO Requirement Restriction for U.S. Appl. No. 10/118,682 dated Apr. 28, 2005; 4 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Sep. 24, 2004; 8 pages.
USPTO Final Rejection for U.S. Appl. No. 10/118,682 dated May 3, 2004; 8 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Nov. 3, 2003; 8 pages.
USPTO Notice of Allowance for U.S. Appl. No. 10/329,162 dated Jul. 5, 2007; 7 pages.
USPTO Non-Final Rejection for U.S. Appl. No. 10/329,162 dated Jan. 29, 2007; 10 pages.
USPTO Final Rejection for U.S. Appl. No. 10/329,162 dated Aug. 25, 2006; 12 pages.
USPTO Non-Final Rejection for U.S. Appl. No. 10/329,162 dated Mar. 10, 2006; 9 pages.
USPTO Final Rejection for U.S. Appl. No. 10/329,162 dated Sep. 21, 2005; 12 pages.
USPTO Non-Final Rejection for U.S. Appl. No. 10/329,162 dated Apr. 21, 2005; 10 pages.
USPTO Advisory Action for U.S. Appl. No. 10/329,162 dated Mar. 29, 2005; 2 pages.
USPTO Final Rejection for U.S. Appl. No. 10/329,162 dated Dec. 15, 2004; 10 pages.
USPTO Non-Final Rejection for U.S. Appl. No. 10/329,162 dated Aug. 2, 2004; 8 pages.
USPTO Final Rejection for U.S. Appl. No. 09/989,767 dated Jan. 18, 2011; 24 pages.
USPTO Notice of Allowance for U.S. Appl. No. 11/201,627 dated Jan. 20, 2011; 8 pages.
USPTO Non-Final Rejection for U.S. Appl. No. 11/200,619 dated Jan. 31, 2011; 14 pages.

* cited by examiner

PROGRAMMABLE SIGMA-DELTA ANALOG-TO-DIGITAL CONVERTER

RELATED APPLICATIONS

This application claims the benefit of U.S. Provisional Application No. 60/912,399, filed Apr. 17, 2007, which is incorporated herein by reference.

TECHNICAL FIELD

This disclosure relates generally to electronic circuits, and more particularly to programmable analog-to-digital converters.

BACKGROUND

Many electronic circuits include analog-to-digital converters that can receive analog input signals and convert them to digital output signals for use during digital signal processing or filtering operations. One common type of analog-to-digital converter is a Sigma-Delta modulator that includes one or more integrators to receive and integrate analog input signals, and one or more quantizers to convert the integrated analog signals into the digital output signals.

When statically configuring Sigma-Delta modulators for inclusion into electronic circuits, system designers often weigh several performance trade-offs, such operational speed, power consumption, and signal-to-noise ratio, etc, according to an intended functionality of the electronic circuit. For instance, system designers can include multiple integrators in the Sigma-Delta modulators—increasing the integration order of the modulator—which can improve the signal-to-noise ratio, but can come at the cost of operational speed and increased power consumption.

SUMMARY

A system includes an analog-to-digital modulator to convert at least one analog input signal into at least one digital output signal. The system also includes a processing device to set an operational order and a quantization level of the analog-to-digital modulator. The analog-to-digital modulator can convert the analog input signal into the digital output signal according to the operational order and the quantization level. The analog-to-digital modulator can include a variable stage integration circuit to perform integration operations on the analog input signal according to the operational order. The analog-to-digital modulator can include a quantization circuit to generate the digital output signal from the integrated analog input signal according to the quantization level set by the processing device. The analog-to-digital modulator can include a feedback circuit to generate a digital feedback signal based, at least in part, on the digital output signal, the processing device to control an introduction of a feedback reference voltage to the variable stage integration circuit responsive to the digital feedback signal.

A method includes setting both an operational order of an integration circuit and a quantization level of a quantization circuit, where the operational order of the integration circuit and the quantization level of the quantization circuit are reconfigurable. The method further includes integrating an analog input signal according to the operational order of the integration circuit, and generating a digital output signal from the integrated analog input signal according to the quantization level of the quantization circuit.

A device includes an integration circuit to perform integration operations on at least one analog input signal according to a reconfigurable operational order of the integration circuit. The device further includes a quantization circuit to generate at least one digital output signal from the integrated analog input signal according to a reconfigurable quantization level of the quantization circuit.

The integration circuit can include multiple analog integrators to integrate the analog input signal, the reconfigurable operational order to indicate a number of the analog integrators the integration circuit utilizes to perform integration operations on the analog input signal. The quantization circuit can include multiple comparators to compare the integrated analog input signal from the integration circuit with one or more programmable reference thresholds.

The device can further include a feedback circuit to generate a digital feedback signal based, at least in part, on the digital output signal, and a reference capacitance circuit having a plurality of selectable capacitors, each capable of providing an input reference voltage to the integration circuit according to the digital feedback signal.

DESCRIPTION OF THE DRAWINGS

The invention may be best understood by reading the disclosure with reference to the drawings.

DETAILED DESCRIPTION

A programmable analog-to-digital converter can be variously configured to tailor its analog-to-digital signal conversion for particular signal processing tasks. This allows electronic systems to optimize performance trade-offs, such as speed, power consumption, and signal-to-noise ratio, on a task-by-task basis. Embodiments are shown and described below in greater detail.

Figure 1:
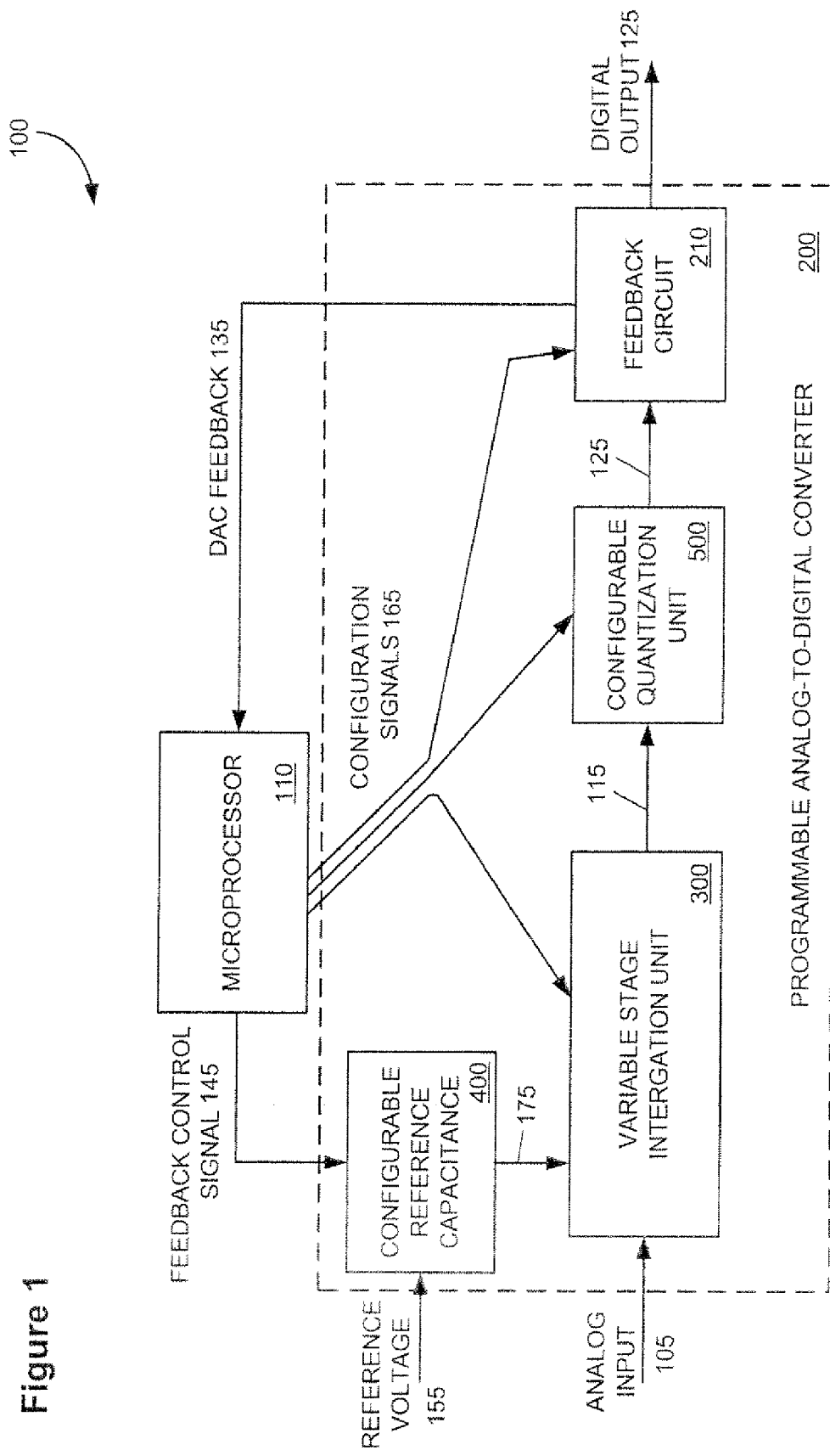
FIG. 1 is a block diagram of an analog-to-digital conversion system according to embodiments of the invention.

FIG. 1 is a block diagram of an analog-to-digital conversion system 100 according to embodiments of the invention. Referring to FIG. 1, the analog-to-digital conversion system 100 includes a programmable analog-to-digital converter (or modulator) 200 to convert an analog input signal 105 into a digital output signal 125. In some embodiments, the programmable analog-to-digital converter 200 can be a Sigma-Delta modulator, which may be configured in a single-ended fashion or as a fully differential circuit.

The analog-to-digital conversion system 100 includes a microprocessor 110 to dynamically reconfigure the programmable analog-to-digital converter 200 in an attempt to optimize various performance trade-offs associated with the programmable analog-to-digital converter 200. In some embodiments, the microprocessor 110 can set an operational order of the programmable analog-to-digital converter 200, can set a quantization level of the programmable analog-to-digital converter 200, and/or can determine an appropriate DAC feedback. The microprocessor 110 can be a processor, controller, microcontroller, or other processing device that executes computer-readable instructions to perform various operations. In some embodiments, the system 100 can include as a discrete set of electronic elements or hardware circuits to perform the same or similar operations as the microprocessor 110.

The programmable analog-to-digital converter 200 includes a variable stage integration unit 300 to receive and integrate the analog input signal 105. The variable stage integration unit 200 can provide the integrated analog signal 115 to a configurable quantization unit 500.

The variable stage integration unit 300 includes a selectable number of integration stages that can be dynamically set by the microprocessor 110, for example, with one or more configuration signals 165. The number of integration stages selected or set by the microprocessor 110 can indicate an operational order of the variable stage integration unit 300. Embodiments of the variable stage integration unit 300 will be shown and described below in greater detail.

The programmable analog-to-digital converter 200 includes a configurable quantization unit 500 to receive and quantize the integrated analog signal 115 from the variable stage integration unit 300 to generate a digital output signal 125. The configurable quantization unit 500 can provide the digital output signal 125 to a feedback circuit 210 for use in a digital-to-analog feedback path.

The configurable quantization unit 500 has a selectable number of quantization levels that quantize the integrated analog signal into the digital output signal 125, for example, where each quantization level corresponds to a bit of data. In some embodiments, the microprocessor 110 can dynamically set the quantization level of the configurable quantization unit 500 with one or more configuration signals 165. Embodiments of the configurable quantization unit 500 will be shown and described below in greater detail.

The programmable analog-to-digital converter 200 includes a feedback circuit 210 to receive the digital output signal 125 from the configurable quantization unit 500 and generate a digital-to-analog (DAC) feedback 135 based on the digital output signal 125. The feedback circuit 210 can provide the DAC feedback 135 to the microprocessor 110 for use in introducing a selectable feedback voltage 175 to the variable stage integration unit 300. In some embodiments, the DAC feedback 135 can include a single-bit or multiple bits, which is controllable or dynamically selected by the microcontroller 110. The feedback circuit 210 can transmit the digital output signal 125 to other digital circuits or electronic elements for further processing, storage, analysis, or presentation.

The microprocessor 110 can generate a feedback control signal 145 responsive to the DAC feedback 135 from the feedback circuit 210 and provide the feedback control signal 145 to a configurable reference capacitance 400. The programmable analog-to-digital converter 200 includes a configurable reference capacitance 400 to receive the feedback control signal 145 from the microprocessor 110 and generate the feedback voltage 175 according to the feedback control signal 145 and a reference voltage 155. The feedback voltage 175 provided to the variable stage integration unit 300 can optimize performance trade-offs, i.e., speed, power consumption, and signal-to-noise ratio, of the programmable analog-to-digital converter 200. Embodiments of the configurable reference capacitance 400 will be shown and described below in greater detail.

Figure 2:
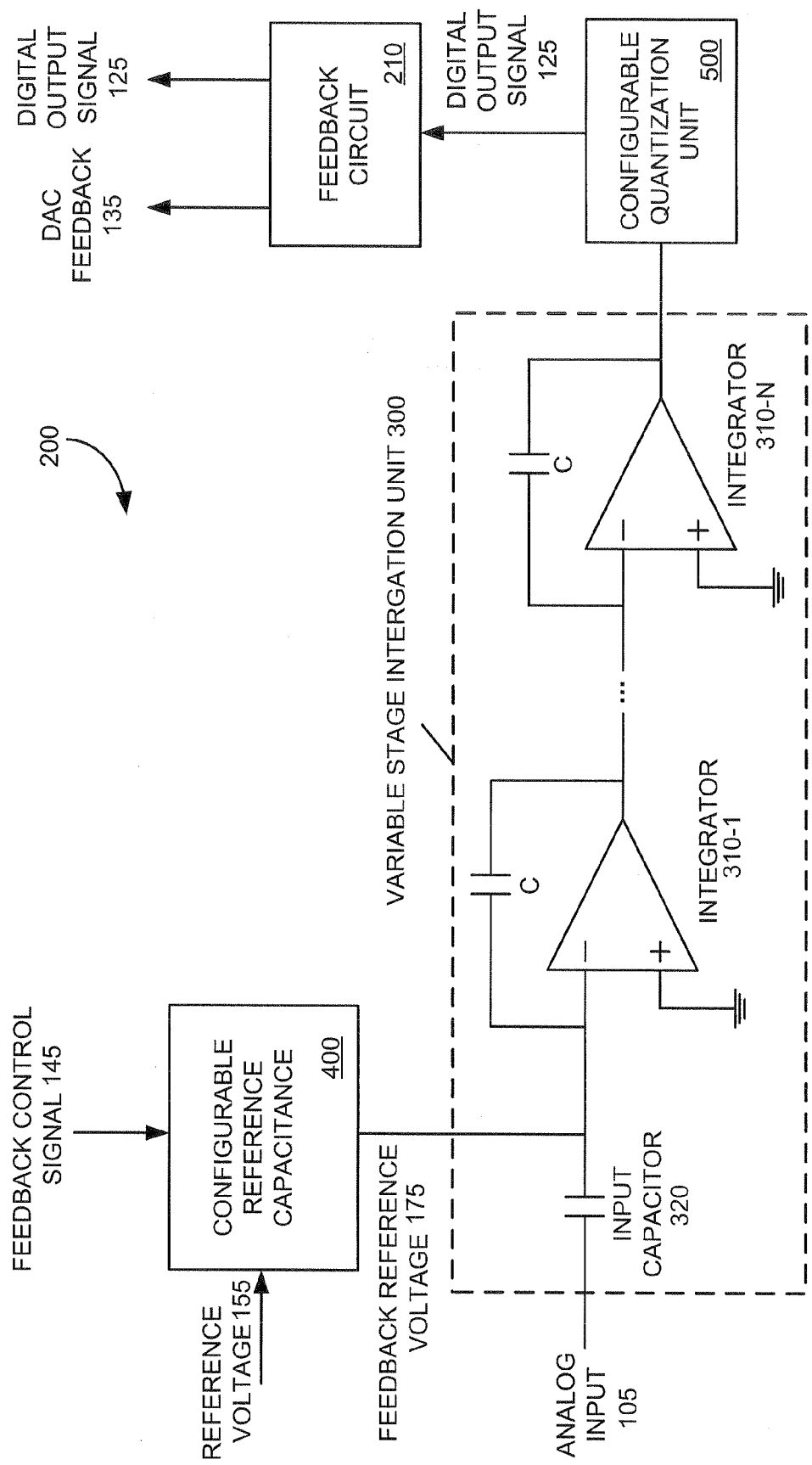
FIG. 2 is a block diagram embodiment of an analog-to-digital converter shown in FIG. 1.

FIG. 2 is a block diagram embodiment of an analog-to-digital converter 200 shown in FIG. 1. Referring to FIG. 2, the analog-to-digital converter 200 includes a variable stage integration unit 300 to receive and integrate an analog input signal 105. The variable stage integration unit 300 includes a plurality of integrators 310-1 to 310-N capable of integrating the analog input signal 105. In some embodiments, the integrators 310-1 to 310-N can have a single-ended configuration or a fully-differential configuration.

The variable stage integration unit 300 is reconfigurable, so any combination of the integrators 310-1 to 310-N can integrate the analog input signal 105. For instance, when the variable stage integration unit 300 is configured as a second order integrator, two of the integrators 310-1 to 310-N are selected to perform integration operations on the analog input signal 105. In some embodiments, a microprocessor 110 (FIG. 1) can provide one or more configuration signals 165 to the variable stage integration unit 300 for reconfiguration, for example, a selection of the integrators 310-1 to 310-N that will integrate the analog input signal 105. Embodiments of this reconfigurability will be described below in detail.

The variable stage integration unit 300 includes an input capacitor 320 to receive and pass the analog input signal 105 to a first selected integrator 310. Although FIG. 2 shows integrator 310-1 receiving the analog input signal 105 from the input capacitor 320, in some embodiments, other integrators 310 can receive the analog input signal 105 from the input capacitor 320.

The variable stage integration unit 300 provides an integrated analog signal 115 to the configurable quantization unit 500 for quantization and generation of the digital output signal 125. The configurable quantization unit 500 is reconfigurable, for example, by the microprocessor 110 (FIG. 1), to set a number of quantization levels or number of bits in the digital output signal 125 per audio sample. Embodiments of the configurable quantization unit 500 will be described below in greater detail.

The configuration quantization unit 500 provides the digital output signal 125 to the feedback circuit 210 for transmission to a digital circuit or other electronic element (not shown). The feedback circuit 200 generates a DAC feedback 135 responsive to the digital output signal 125. This DAC feedback 135 can be a single-bit feedback, or multiple-bit feedback depending on the configuration of the analog-to-digital converter 200.

The analog-to-digital converter 200 includes a configuration reference capacitance 400 to receive a feedback control signal 145, for example, from a microprocessor 110 (FIG. 1) responsive to the DAC feedback 135. The feedback control signal 145 can select one or more capacitors in the configuration reference capacitance 400 to receive a reference voltage 155 and provide a feedback reference voltage 175 to the variable stage integration unit 300. In some embodiments, the feedback reference voltage 175 is provided to a circuit node associated with the output of the input capacitor 320, or the input of a first selected integrator 310. Embodiments of the configurable reference capacitance 400 will be described below in greater detail.

Figure 3:
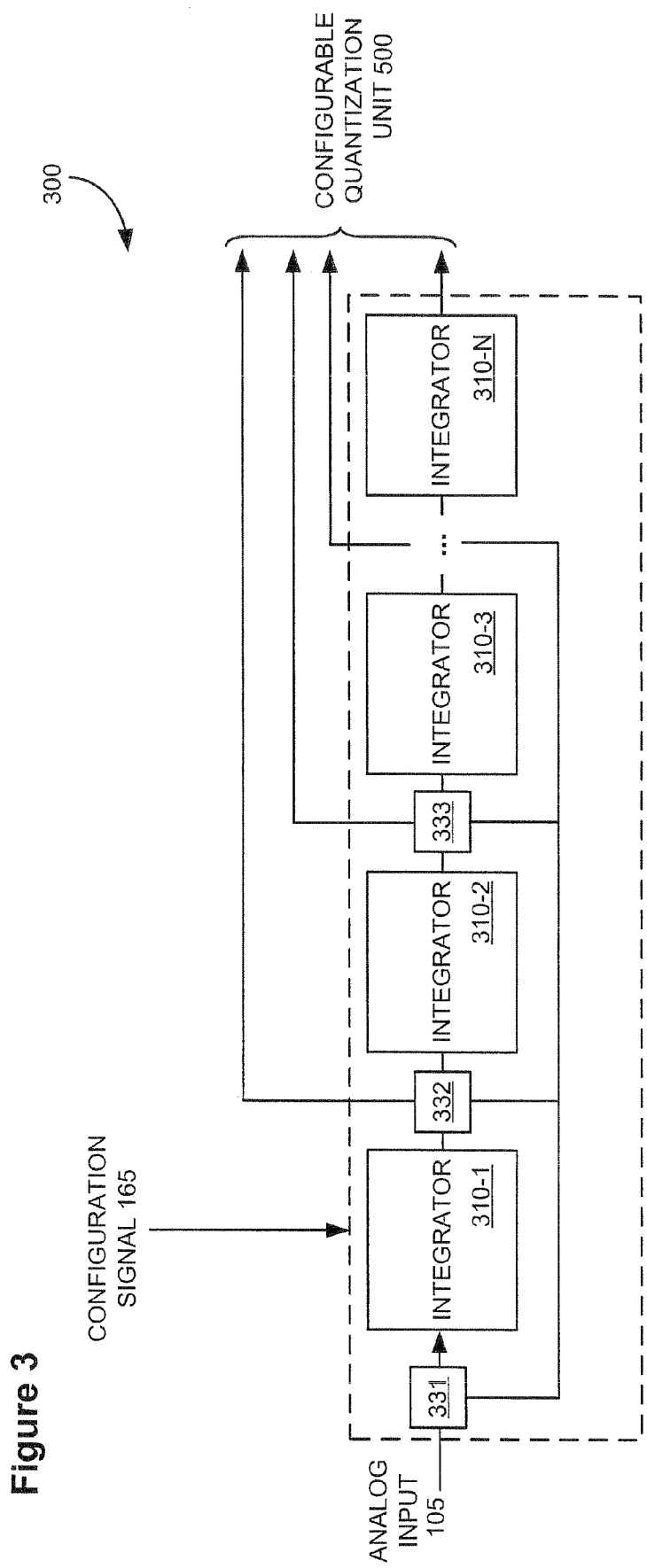
FIG. 3 is a block diagram embodiment of a variable stage integration unit shown in FIGS. 1 and 2.

FIG. 3 is a block diagram embodiment of a variable stage integration unit 300 shown in FIGS. 1 and 2. Referring to FIG. 3, the variable stage integration unit 300 includes a plurality of integrators 310-1 to 310-N to integrate an analog input signal 105. The integrators 310-1 to 310-N can be arranged in series and can be single-ended integrators or fully-differential integrators.

The variable stage integration unit 300 includes multiple switches, i.e., switches 331-333, to determine an integration path (or paths) for the analog input signal 105 through the integrators 310. For instance, the switch 331 can direct the analog input signal 105 to integrator 310-1 or to one or more of the other integrators 310-2 to 310-N, while switches 332-333 can provide the analog input signal 105 or an integrated input signal to integrators 310-2 and 310-3, respectively. Switches 332-333 can also direct an output from integrators 310-1 and 310-2 to the configurable quantization unit 500. In some embodiments, the switches 331-333 can be set by one or more configuration signals 165, for example, from a microprocessor 110 (FIG. 1).

The operational order of the variable stage integration unit 300 can be set according to the number of integrators 310-1 to 310-N that are selected to integrate the analog input signal 105. For instance, when 1 integrator is selected the variable stage integration unit 300 is a first order integrator, but when all N integrators are selected the variable stage integration unit 300 is an Nth order integrator.

When performing second order integration, for example, with integrators 310-1 and 310-2, the switch 331 can be set to provide the analog input signal 105 to integrator 310-1, switch 332 can be set to provide the integrated output of the integrator 310-1 to integrator 310-2, and switch 333 can be set to provide the integrated output from integrator 310-2 to the configurable quantization unit 500. Thus, the variable stage integration unit 300 configured as a second order integrator would be able to use two integrators 310-1 and 310-2 to integrate the analog input signal 105. Since the switches can be dynamically set according to one or more configuration signals 165, the order and overall integration associated with the variable stage integration unit 300 can be reconfigured according to any requirements of the system.

Figure 4:
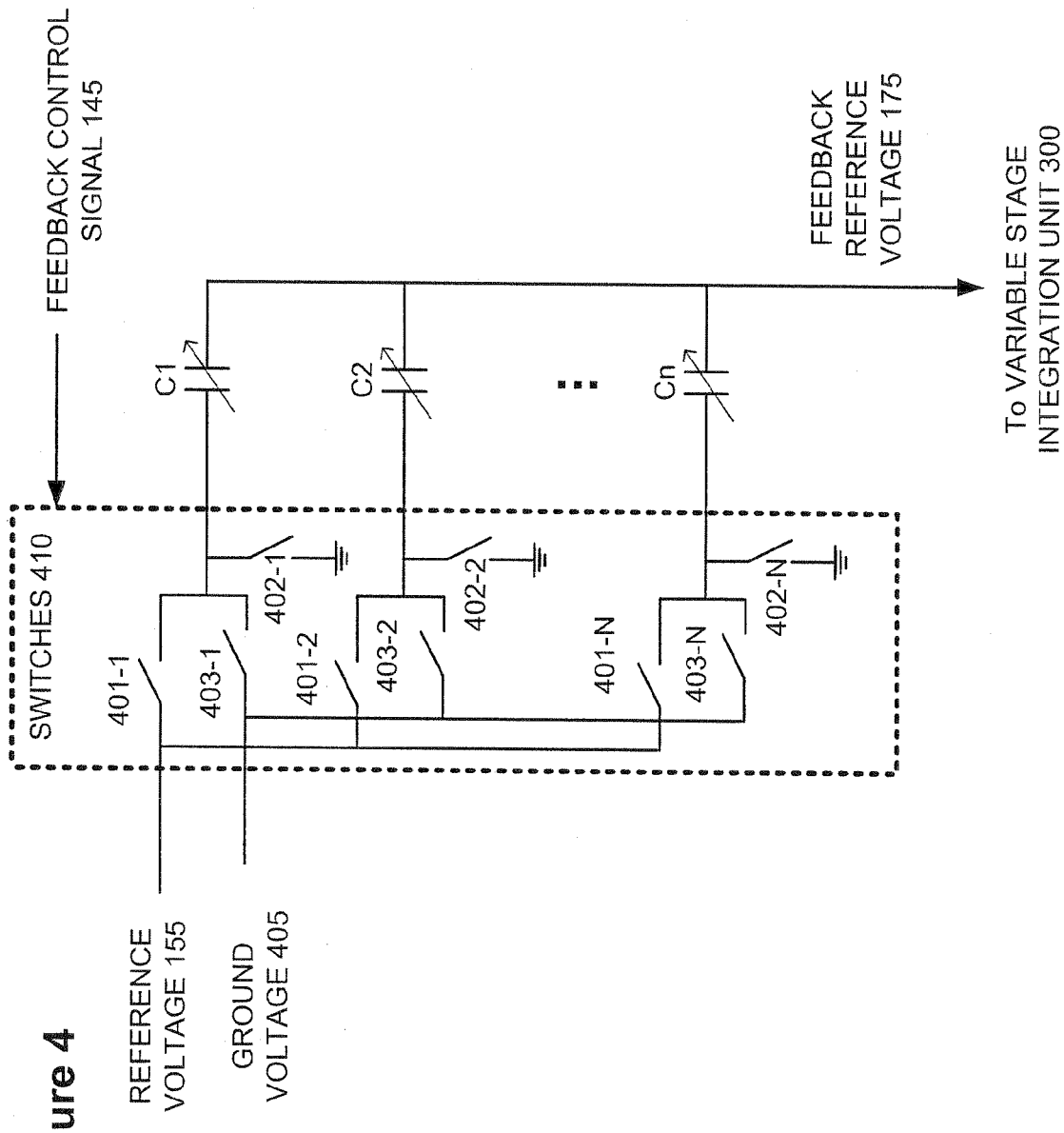
FIG. 4 is a block diagram embodiment of a configurable reference capacitance shown in FIGS. 1 and 2.

FIG. 4 is a block diagram embodiment of a configurable reference capacitance 400 shown in FIGS. 1 and 2. Referring to FIG. 4, the configurable reference capacitance 400 includes a plurality of capacitors C1-Cn arranged in parallel. The capacitors C1-Cn can be configured to have any capacitance value(s).

Each capacitor C1-Cn can receive a reference voltage 155 or a ground voltage 405 depending on the orientation of switches 410, such as switches 401-1 to 401-N and 403-1 to 403-N. In some embodiments, the switches 410, including switches 401-1 to 401-N, 402-1 to 402-N, and 403-1 to 403-N can be controlled according to a feedback control signal 145, for example, from a microprocessor 110 (FIG. 1) in response to a DAC feedback 135.

When the switches 401-1 to 401-N are open, the corresponding capacitors C1-Cn do not receive the reference voltage 155. When the switches 401-1 to 401-N are closed, the corresponding capacitors C1-Cn can receive the reference voltage 155 and provide a feedback reference voltage 175 to the variable stage integration unit 300. When the switches 403-1 to 403-N are open, the corresponding capacitors C1-Cn do not receive the ground voltage 405. When the switches 403-1 to 403-N are closed, the corresponding capacitors C1-Cn can receive the ground voltage 405 and provide a feedback reference voltage 175 to the variable stage integration unit 300. The switches 410 in the configurable reference capacitance 400 also include switches 402-1 to 402-N, each coupled between a ground and their respective capacitors C1-Cn. These switches 402-1 to 402-N can be closed to discharge their respective capacitors C1-Cn. In some embodiments, the switches 402-1 to 402-N can be controlled according to a feedback control signal 145, for example, from a microprocessor 110 (FIG. 1) in response to a DAC feedback 135.

The parallel configuration of the multiple dynamically selectable capacitors C1-Cn allows for finer capacitance granularity of the configurable reference capacitance 400. This finer capacitance granularity grants control to the analog-to-digital conversion system 100 in the characteristics of the feedback reference voltage 175 and the ability to optimize trade-offs, such as speed, power consumption, and signal-to-noise ratio.

Figure 5:
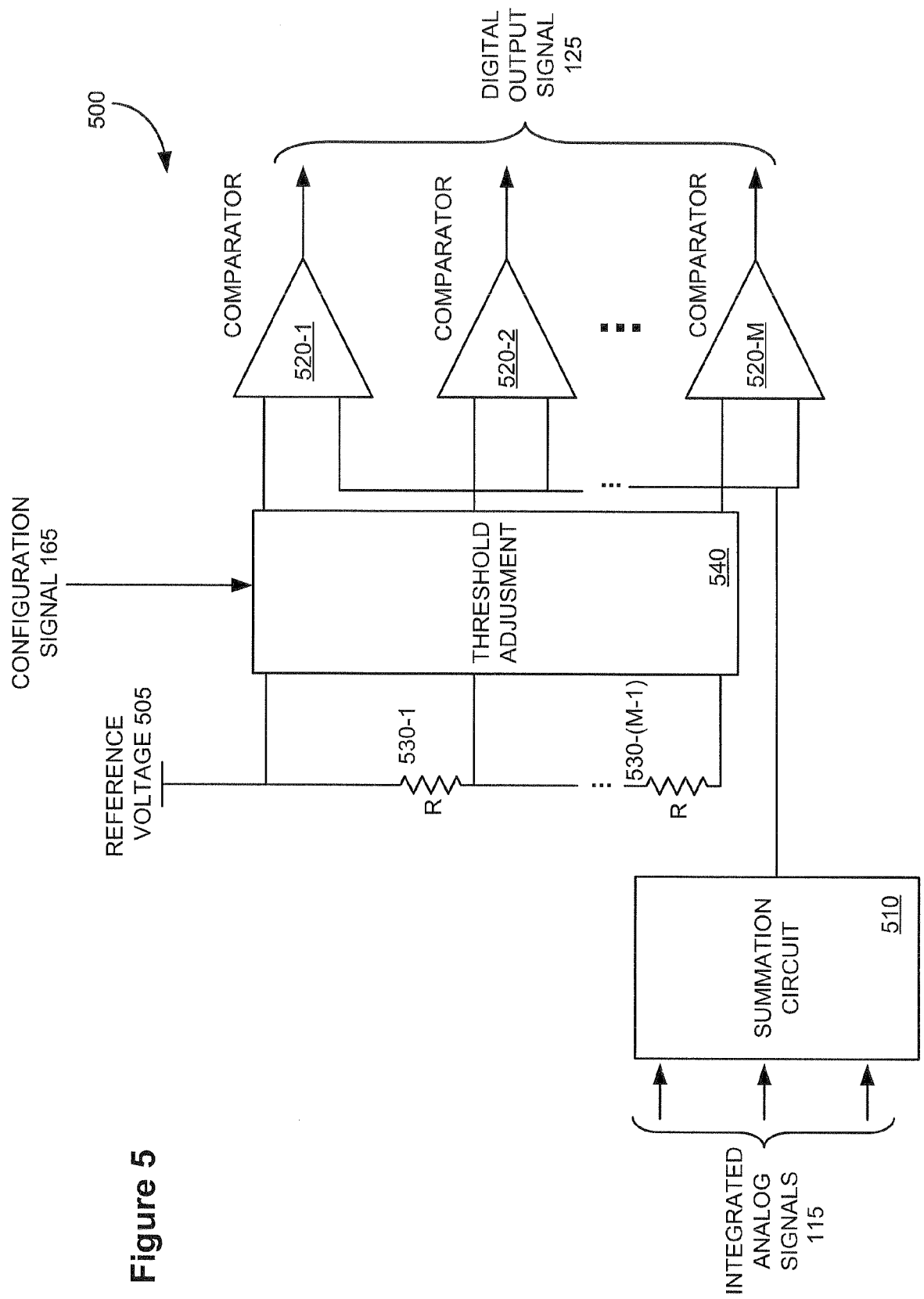
FIG. 5 is a block diagram embodiment of a configurable quantization unit shown in FIGS. 1 and 2.

FIG. 5 is a block diagram embodiment of a configurable quantization unit 500 shown in FIGS. 1 and 2. Referring to FIG. 5, the configurable quantization unit 500 includes a plurality of comparators 520-1 to 520-M to generate a digital output signal 125 from an integrated analog signal 115. Each comparator 520-1 to 520-M can generate at least a portion of the digital output signal 125, for example, one bit of the digital output signal 125 per audio sample. In some embodiments, the comparators 520-1 to 520-M can be configured as single-ended or fully-differential devices.

The comparators 520-1 to 520-M receive one or more integrated analog signals 115 and compare them to a reference threshold to determine at least a portion of the digital output signal 125. In some embodiments, the comparators 520-1 to 520-M receive the integrated analog signal 115 from a summation circuit 510, which adds multiple integrated analog signals 115 from the variable stage integration unit 300. In some embodiments, the summation circuit 510 is provided separately from the configurable quantization unit 500, or not included in the analog-to-digital converter 200. Although FIG. 5 shows each comparator 520-1 to 520-M receiving the same integrated analog signal, in some embodiments, various integrated analog signals can be provided to different comparators 520-1 to 520-M, or not provide to particular comparators 520-1 to 520-M at all.

The reference threshold is provided to the comparators 520-1 to 520-M from a reference voltage 505 through a resistor string or ladder having multiple resistors 530-1 to 530-(M−1) coupled in series. In some embodiments, the reference voltage 505 and/or resistance values of the resistors 530-1 to 530-(M−1) are programmable, thus allowing an external device, such as the microprocessor 110 (FIG. 1), to control the voltage level of the reference threshold provided to the comparators 520-1 to 520-M.

The configurable quantization unit 500 includes a threshold adjustment 540 to adjust the reference threshold from the resistor string prior to being provided to the comparators 520-1 to 520-M. The threshold adjustment 540 can adjust the reference threshold according to a count associated with the comparators 520-1 to 520-M, a tap value of the comparators, a gain level, etc.

The threshold adjustment 540 adjust the reference threshold from the resistor string according to configuration signals 165 from the microprocessor 110 (FIG. 1) and then provides the adjusted reference threshold to the comparators 520-1 to 520-M. The threshold adjustment 540 is programmable with the configuration signals 165, and thus allows the microprocessor 110 control over the reference threshold provided to the comparators 520-1 to 520-M.

The configurable quantization unit 500 can be reconfigured to have a variable number of quantization levels, i.e., the number of comparators 520-1 to 520-M utilized to generate at least a portion of the digital output signal 125 and/or the integrated analog signals and reference thresholds provided to the comparators 520-1 to 520-M is fully reconfigurable. In some embodiments, the microprocessor 110 (FIG. 1) can dynamically determine and set the number of comparators 520-1 to 520-M that generate at least a portion of the digital output signal 125 and the integrated analog signals and reference thresholds provided to the comparators 520-1 to 520-M. This allows the analog-to-digital conversion system 100 the ability to optimize performance trade-offs for various processing functions.

Figure 6:
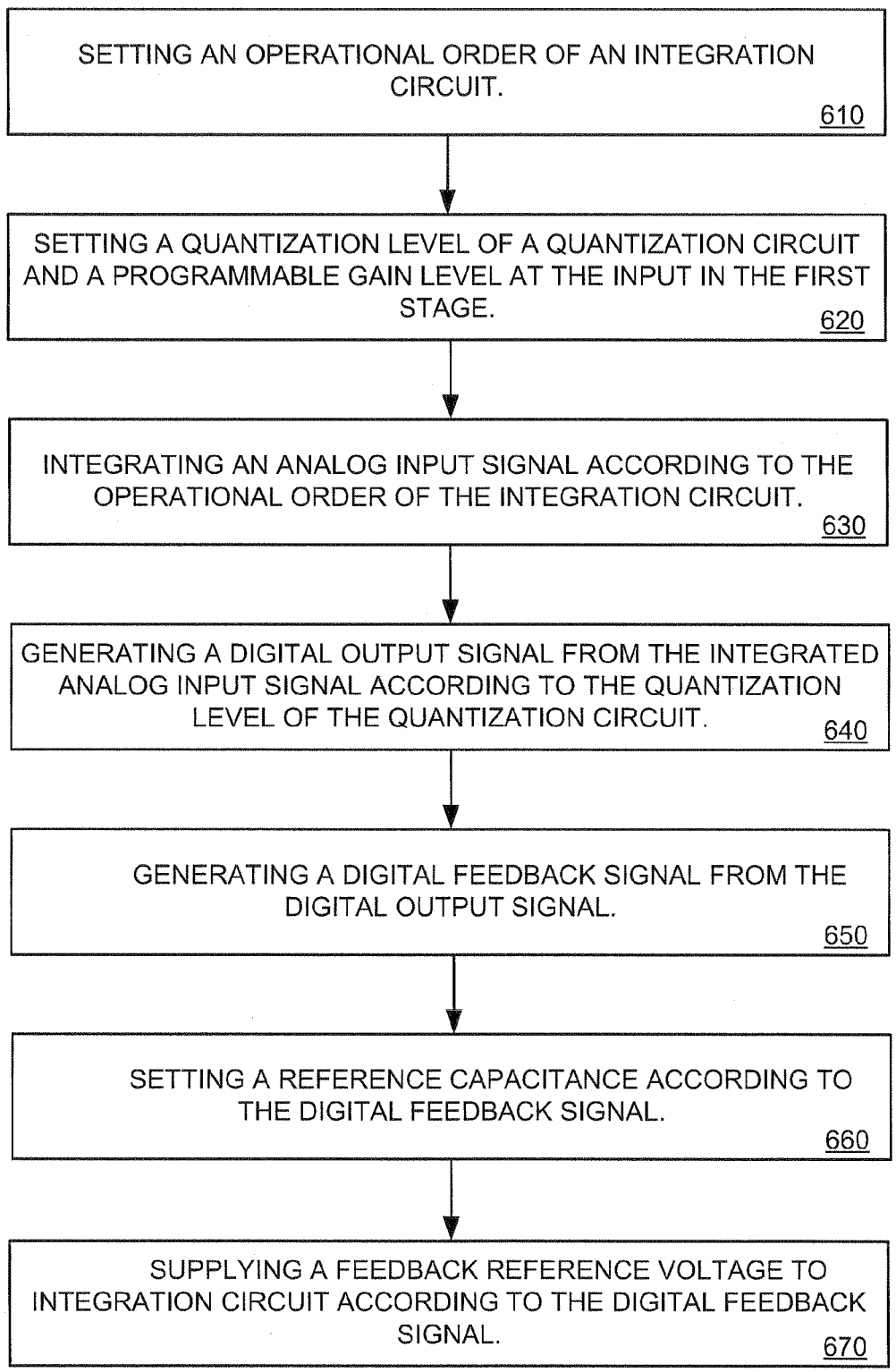
FIG. 6 is an example operational flowchart for the analog-to-digital conversion system is shown in FIG. 1.

FIG. 6 is an example operational flowchart for the analog-to-digital conversion system 100 is shown in FIG. 1. Referring to FIG. 6, the analog-to-digital conversion system 100 sets an operational order of an integration circuit, such as variable stage integration unit 300, in block 610, and a quantization level of a quantization circuit, such as configurable quantization unit 500, in block 620. The analog-to-digital conversion system 100 can also set a programmable gain level at an input to the first stage of the configurable quantization unit 500.

In some embodiments, a microprocessor 110 can set the operational order of the integration circuit by selecting one or more integrators in the integration circuit to perform integration operations. The microprocessor 110 can also set the quantization level of the quantization circuit by selecting one or more comparators in the quantization circuit to perform quantization operations.

The operational flowchart continues to block 630 and integrates an analog input signal according to the operational order of the integration circuit. The integration of the analog input signal can be performed by the integrators selected by the microprocessor 110.

The operational flowchart continues to block 640 and generates a digital output signal from the integrated analog input signal according to the quantization level of the quantization circuit. The digital output signal can be generated by the selected comparators in the quantization circuit.

The operational flowchart continues to block 650 and generates a digital feedback signal from the digital output signal. The digital feedback signal can be a digital-to-analog (DAC) feedback that is sent to the microprocessor 110.

The operational flowchart continues to block 660 and sets a reference capacitance according to the digital feedback signal. In some embodiments, the microprocessor 110 can generate a feedback control signal from the DAC feedback, which sets the reference capacitance by selecting one or more capacitors to receive a reference voltage.

The operational flowchart continues to block 640 and supplies a feedback reference voltage to integration circuit according to the digital feedback signal in block 670. The feedback reference voltage can enhance the operation of the analog-to-digital conversion system 100 by helping to optimize various performance trade-offs, such as speed, power consumption, and signal-to-noise ratio.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

The invention claimed is:

1. A system comprising:
    an analog-to-digital modulator to convert at least one analog input signal into at least one digital output signal, where the analog-to-digital modulator includes a variable stage integration circuit to perform integration operations on the analog input signal according to an operational order; and
    a processing device to set the operational order and a quantization level of the analog-to-digital modulator, the analog-to-digital modulator to convert the analog input signal into the digital output signal according to the operational order and the quantization level wherein the processing device determines a feedback reference voltage to optimize performance trade-offs in the system.

2. The system of claim 1, where the variable stage integration circuit includes multiple integrators to perform integration operations on the analog input signal, the processing device to set the operational order of the analog-to-digital modulator by dynamically selecting one or more of the integrators to perform integration operations on the analog input signal.

3. The system of claim 1, where the analog-to-digital modulator includes a quantization circuit to generate the digital output signal from the integrated analog input signal according to the quantization level set by the processing device.

4. The system of claim 3, where the quantization circuit includes multiple comparators, when dynamically selected by the processing device, to compare the integrated analog input signal from the variable stage integration circuit with one or more programmable reference thresholds, the processing device to control voltage levels associated with the programmable reference thresholds.

5. The system of claim 1, where the analog-to-digital modulator includes a feedback circuit to generate a digital feedback signal based, at least in part, on the digital output signal, the processing device to control an introduction of the feedback reference voltage to the variable stage integration circuit responsive to the digital feedback signal.

6. The system of claim 5, where the analog-to-digital modulator includes a reconfigurable reference capacitance circuit having a plurality of capacitors capable of supplying corresponding capacitance voltages to the variable stage integration circuit as the feedback reference voltage, the processing device to select one or more of the capacitors to supply the associated capacitance voltages to the variable stage integration circuit.

7. A method comprising:
    setting both an operational order of an integration circuit and a quantization level of a quantization circuit, where the operational order of the integration circuit and the quantization level of the quantization circuit are reconfigurable, and where the operational order of the integration circuit indicates a number of analog integrators utilized by the integration circuit to integrate the analog input signal;
    integrating an analog input signal according to the operational order of the integration circuit; and
    generating a digital output signal from the integrated analog input signal according to the quantization level of the quantization circuit wherein a processing device determines a feedback reference voltage to optimize performance trade-offs in the system.

8. The method of claim 7 where the quantization level of the quantization circuit indicates a number of comparators utilized by the quantization circuit to generate the digital output signal.

9. The method of claim 8, where the comparators, when selected according to the quantization level, each generate one bit of the digital output signal from the integrated analog signal per audio sample.

10. The method of claim 8, includes providing programmable voltage thresholds to the comparators, where the comparators are configured to compare the integrated analog signal to the corresponding programmable voltage thresholds when generating the digital output signal from the integrated analog signal.

11. The method of claim 7, includes
  generating the digital feedback signal from the digital output signal; and
  supplying a feedback reference voltage to integration circuit according to the digital feedback signal.

12. The method of claim 11, includes selecting one or more capacitors to supply the feedback reference voltage to the integration circuit according to the digital feedback signal.

13. A device comprising:
  an integration circuit to perform integration operations on at least one analog input signal according to a reconfigurable operational order of the integration circuit, where the integration circuit includes multiple analog integrators to integrate the analog input signal, the reconfigurable operational order to indicate a number of the analog integrators the integration circuit utilizes to perform integration operations on the analog input signal; and
  a quantization circuit to generate at least one digital output signal from the integrated analog input signal according to a reconfigurable quantization level of the quantization circuit wherein a processing device determines a feedback reference voltage to optimize performance tradeoffs in the system.

14. The device of claim 13, where the quantization circuit includes multiple comparators to compare the integrated analog input signal from the integration circuit with one or more programmable reference thresholds.

15. The device of claim 13, where the reconfigurable quantization level to indicate a number of the comparators the quantization circuit utilizes generate at least one digital output signal from the integrated analog input signal.

16. The device of claim 15, where the reconfigurable quantization level indicates a number of bits representing the digital output signal per audio sample.

17. The device of claim 13, including
  a feedback circuit to generate a digital feedback signal based, at least in part, on the digital output signal; and
  a reference capacitance circuit having a plurality of selectable capacitors, each capable of providing an input reference voltage to the integration circuit according to the digital feedback signal.

* * * * *